US005548574A

United States Patent [19]
Shimoyoshi et al.

[11] Patent Number: 5,548,574
[45] Date of Patent: Aug. 20, 1996

[54] APPARATUS FOR HIGH-SPEED RECORDING COMPRESSED DIGITAL AUDIO DATA WITH TWO DIMENSIONAL BLOCKS AND ITS COMPRESSING PARAMETERS

[75] Inventors: Osamu Shimoyoshi; Kenzo Akagiri, both of Kanagawa; Hiroshi Suzuki, Saitama; Makoto Mitsuno, Chiba, all of Japan

[73] Assignee: Sony Corporation, Japan

[21] Appl. No.: 205,319

[22] Filed: Mar. 3, 1994

[30] Foreign Application Priority Data

Mar. 9, 1993 [JP] Japan .................................. 5-047943

[51] Int. Cl.[6] .............................. H03M 7/30; G11B 7/00
[52] U.S. Cl. ............................. 369/124; 369/47; 369/86; 395/2.13; 395/2.14; 341/51; 341/54
[58] Field of Search ........................ 369/124, 58, 275.3, 369/47, 48, 54, 86; 360/53, 32, 48; 381/37, 30, 36, 41, 31; 395/2.38, 3.95, 2.12, 2.14, 2.13; 341/51, 50, 54, 64

[56] References Cited

U.S. PATENT DOCUMENTS

| 4,184,049 | 1/1980 | Crochiere et al. | 179/1 |
|---|---|---|---|
| 4,535,472 | 8/1985 | Tomcik | 381/31 |
| 4,706,265 | 11/1987 | Furukawa | 375/122 |
| 4,896,362 | 1/1990 | Veldhuis et al. | 381/30 |
| 4,972,484 | 11/1990 | Theile et al. | 381/37 |
| 5,040,217 | 8/1991 | Brandenburg et al. | 381/47 |
| 5,105,463 | 4/1992 | Veldhuis et al. | 381/30 |
| 5,109,417 | 4/1992 | Fielder et al. | 381/36 |

(List continued on next page.)

FOREIGN PATENT DOCUMENTS

| 0255111A2 | 2/1988 | European Pat. Off. | G11B 20/10 |
|---|---|---|---|
| 0370277A3 | 5/1990 | European Pat. Off. | H04B 1/66 |
| 0409248A2 | 1/1991 | European Pat. Off. | H03M 7/30 |
| 0420745A2 | 4/1991 | European Pat. Off. | H04B 1/66 |
| 0423050A1 | 4/1991 | European Pat. Off. | H04B 1/66 |
| 0424016A3 | 4/1991 | European Pat. Off. | H04B 1/66 |
| 0446031A3 | 9/1991 | European Pat. Off. | H04B 1/66 |
| 0458645A2 | 11/1991 | European Pat. Off. | H04B 1/66 |
| 0473367A1 | 3/1992 | European Pat. Off. | H03M 7/30 |
| 0525809A2 | 2/1993 | European Pat. Off. | H04B 1/66 |
| WO90/09064 | 8/1990 | WIPO | H04B 1/66 |
| WO92/17884 | 10/1992 | WIPO | G11B 20/10 |

OTHER PUBLICATIONS

T. Makiko et al., "Block Size Decision Method for Movement Compensation," Japanese Patent Abstract, Publication No.: JP1069181, Publication Date: Mar. 15, 1989; vol. 13, No.: 285.

D. Esteban et al., "Application of Quadrature Mirror Filters to Split Band Voice Coding Schemes," 1977 IEEE International Conference on Acoustics, Speech & Signal Processing, May 1977, pp. 191–195.

(List continued on next page.)

*Primary Examiner*—Georgia Y. Epps
*Assistant Examiner*—Kim-Kwok Chu
*Attorney, Agent, or Firm*—Limbach & Limbach L.L.P.; Charles P. Sammut

[57] ABSTRACT

Methods and apparatus for recording, reproducing, transmitting and/or receiving compressed data, and a recording medium therefor, utilize frequency dividing filters for dividing the frequency range of digital signals into plural frequency bands, orthogonal transform circuits for producing signal components in plural two-dimensional blocks along time and frequency, an adaptive bit allocation and encoding circuit for quantizing and compressing the information for each two-dimensional block and a bit allocation and calculating circuit. When recording the information together with information compressing parameters for each two-dimensional block, the information compressing parameters for at least two two-dimensional blocks are recorded collectively to avoid complicacy in the structure of the sampling frequency signal generating circuits or the like otherwise caused in case of providing plural sampling frequencies as well as to prevent an increase in hardware scale.

122 Claims, 19 Drawing Sheets

5,548,574
Page 2

U.S. PATENT DOCUMENTS

| | | | |
|---|---|---|---|
| 5,115,240 | 5/1992 | Fujiwara et al. | 341/5.1 |
| 5,117,228 | 5/1992 | Fuchigami et al. | 341/220 |
| 5,142,656 | 8/1992 | Fielder et al. | 381/37 |
| 5,150,387 | 9/1992 | Yoshikawa et al. | 375/122 |
| 5,157,760 | 10/1992 | Akagiri | 395/2 |
| 5,166,686 | 11/1992 | Sugiyama | 341/155 |
| 5,185,800 | 2/1993 | Mahieux | 381/29 |
| 5,218,561 | 6/1993 | Iwadare | 364/725 |
| 5,241,603 | 8/1993 | Akagiri et al. | 381/37 |
| 5,243,588 | 9/1993 | Maeda et al. | 369/54 |
| 5,244,705 | 9/1993 | Tsurushima et al. | 428/64 |
| 5,264,846 | 11/1993 | Oikawa | 341/76 |
| 5,268,685 | 12/1993 | Fujiwara | 341/76 |
| 5,301,205 | 4/1994 | Tsutsui et al. | 375/1 |
| 5,381,143 | 1/1995 | Shimoyoshi et al. | 381/37 |
| 5,388,093 | 2/1995 | Yoshida et al. | 369/124 |
| 5,388,209 | 2/1995 | Akagiri | 395/2.38 |
| 5,406,428 | 4/1995 | Suzuki | 360/53 |

OTHER PUBLICATIONS

J. H. Rothweiler, "Polyphase Quadrature Filters—A New Subband Coding Technique," ICASSP 83 Proceedings, IEEE International Conference on Acoustics, Speech & Signal Processing, Apr. 1983, vol. 3 of 3, pp. 1280–1283.

E. F. Schröder et al., "High Quality Digital Audio Encoding with 3.0 Bits/Sample using Adaptive Transform Coding," AES 80th Convention Mar. 4–7, 1986, Switzerland, Audio Engineering Society Preprint, pp. 1–7.

G. Stoll et al., "Masking–pattern adapted subband coding: use of the dynamic bit–rate margin," AES 84th Convention Mar. 1–4, 1988, Paris, Audio Engineering Society Preprint, pp. 1–33.

Y. Mahieux et al., "Transform Coding of Audio Signals at 64 KBIT/S," Globecom '90, IEEE Global Telecommunications Conference & Exhibition, Dec. 2–5, 1990, California, pp. 405.2.1–405.2.5.

K. Brandenburg et al., "Aspec: Adaptive spectral entropy coding of high quality music signals," AES 90th Convention, Feb. 19–22, 1991, Paris, Audio Engineering Society Preprint, pp. 1–10, including one page of Figs. 1 and 2.

S. Gomez et al., "An application–specific FFT processor," Electronic Engineering, Jun. 1988, No. 738, pp. 99–100 and 104–106.

S. Magar et al., "An Application Specific DSP Chip Set for 100 MHz Data Rates," ICASSP 88, IEEE International Conference on Acoustics, Speech & Signal Processing, pp. 1989–1992.

J. D. Johnston, "Perceptual Transform Coding of Wideband," IEEE Journal, 1989, pp. 1993–1996.

N. Jayant, "Signal Compression: Technology Targets and Research Directions," IEEE Journal of Selected Areas in Communications, Jun. 1992, vol. 10, No. 5, pp. 796–810.

R. E. Crochiere et al., "Digital Coding of Speech in Sub–bands," American Telephone and Telegraph Company, The Bell System Technical Journal, vol. 55, No. 8, Oct. 1976, pp. 1069–1085.

J. P. Princen et al., "Subband/Transform Coding Using Filter Bank Designs on Time Domain Aliasing Cancellation," IEEE 1987, pp. 2161–2164.

R. Zelinski et al., "Adaptive Transform Coding of Speech Signals," IEEE Transactions on Acoustics, Speech, and Signal Processing, vol. ASSP–25, No. 4, Aug. 1977, pp. 299–309.

M. A. Krasner, "The Critical Band Coder–Digital Encoding of Speech Signals Based on the Perceptual Requirements of the Auditory System," IEEE Journal, vol. 1–3, 1980, pp. 327–331.

Transform Coding of Audio Signals Using Perceptual Noise Criteria, James D. Johnston IEEE Journal On Selected Areas In Communicatioins, vol. 6, No. 2, Feb. 1988.

APPARATUS FOR HIGH-SPEED RECORDING COMPRESSED DIGITAL AUDIO DATA WITH TWO DIMENSIONAL BLOCKS AND ITS COMPRESSING PARAMETERS

BACKGROUND OF THE INVENTION

This invention relates to methods and apparatus for recording and/or reproducing compressed data, that is bit-compressed digital audio signals or the like, methods and for transmitting and/or receiving the compressed data, and a recording medium therefor. More particularly, it relates to an apparatus, technique and a recording medium for recording with the compression mode of plural bit rates.

The present Assignee has already proposed in our U.S. Pat. Nos. 5,243,588 and 5,244,705 a technique consisting of bit-compressing input digital audio signals and recording the bit-compressed signals in a burst fashion with a pre-set data volume as a recording unit.

This technique resides in employing a magneto-optical disc as a recording medium and recording and/or reproducing AD (adaptive differential) PCM audio data as prescribed in audio data formats such as CD-I (CD-Interactive) or CD-ROM XA. The AD-PCM audio data is recorded in a burst fashion on the magneto-optical disc with, for example, 32 sectors of the AD-PCM data and a few linking sectors for interleaving, forming one recording unit.

Several modes may be selected of the AD-PCM audio data in the recording and/or reproducing apparatus employing the magneto-optical disc. For example, a level A with a compression ratio twice that of the conventional compact disc (CD) and a sampling frequency of 37.8 kHz, a level B with a compression ratio four times that of the conventional compact disc (CD) and a sampling frequency of 37.8 kHz and a level C with a compression ratio eight times that of the conventional compact disc (CD) and a sampling frequency of 18.9 kHz, are prescribed. That is, with the above-mentioned level B, the digital audio data is compressed to approximately one/fourth of the original volume, with the replay time of the disc recorded with the level B mode being four times that with the standard CD format. This indicates that the apparatus may be reduced in size because a recording/reproducing time about as long as that achieved with a standard size disc of 12 cm in diameter may be achieved with a smaller sized disc.

However, since the rotational speed of the disc is the same as that of a standard CD, the amount of the compressed data obtained with the level B per a pre-set time is four times that of the standard CD. Consequently, the same compressed data is repeatedly read four times, in a time unit of, for example, a sector or a cluster, and only one of the four superimposed compressed data is transmitted to audio reproduction. Specifically, during scanning or tracking of a spiral recording track, a track jump to return to the starting track position is performed for each revolution in order to repeatedly track the same spiral track four times. This indicates that at least one of the four scans of compressed sound data from the repeated reading operations suffices. Hence, the disclosed technique is effective against errors caused by disturbances, and consequently may be especially suitable for use in connection with a small-sized portable type device.

Since, a semiconductor memory will be employed in the future as a recording medium, it would be desirable to achieve further bit compression in order to improve compression efficiency. Specifically, audio signals are recorded and/or reproduced using a so-called IC card (which includes one or more such semiconductor memories), on or from which bit-compressed data is recorded or reproduced, respectively.

With the IC card, increases in storage capacity or lower costs are achieved through progress in semiconductor technology. Notwithstanding such progress, when the IC card was first supplied to the market, the IC card was believed to have inadequate storage capacity, and furthermore, was expensive. Therefore, it may be contemplated to repeatedly transfer the recording contents of an inexpensive large-capacity recording medium, such as the magneto-optical disc, to the IC card by re-writing data a number of times. Specifically, desired musical numbers recorded on the magneto-optical disc are dubbed to the IC card and exchanged (or overwritten) with other musical numbers already stored in the IC card. By frequently re-writing the contents of the IC card in this manner, a wide variety of musical numbers may be enjoyed outdoors with a small number of IC cards which are on hand.

For recording/reproducing audio signals, however, the frequency bandwidths and the signal to noise characteristics differ for a variety of applications. For example, if high quality audio signals are desired, the bandwidth of from 15 kHz to 20 kHz and a good signal to noise ratio are required. For such purposes, a higher bit rate is tolerated. The bit rate in this case is usually 256 kbps to 64 kbps per channel.

Conversely, if, for the most pan, audio signals are handled, a bandwidth of 5 to 7 kHz suffices, while a significantly high signal to noise ratio is not required. However, in order to increase recording/reproducing time for a given memory size, it is desirable to lower the bit rate from 64 kbps to several kbps. In light of the above, it is necessary to provide a recording/reproducing apparatus which is capable of accommodating the plural usages having different demand levels and in which it is possible to reduce the economic load to the maximum extent possible. However, if plural modes having different bandwidths have to be provided, it therefore is necessary to support plural sampling frequencies, with the result that the sampling frequency signal generating circuit tends to be complex or the LSI scale tends to be unavoidably increased. In addition, if the sampling frequency differs from one mode to another, it is difficult to transfer the information from one mode to another. If it is desired to write high bit rate mode information recorded on a large-capacity magneto-optical disc onto a small-capacity IC card at a low bit rate mode, it is necessary to completely annul the compression mode to restore the information to time-domain signals and to re-compress the signals at a low bit rate mode, with the consequence that the quantity of the arithmetic-logical steps is increased, thereby increasing the difficulty of real-time processing.

With the modes having increasingly low bit rates, however, the sound quality is lowered due to the decrease in the number of usable bits. If, when the bandwidth is narrowed, the bandwidth of the frequency division for compression is constant over the entire frequency range, the bandwidth resulting from division of the entire frequency range of 20 kHz into 32 bands of equal widths is 700 Hz, which is significantly wider than the low-range critical band of 100 Hz and wider than the critical bands for the major portion of the frequency range. The result is the significantly lowered compression efficiency. However, if, when the bit rate is lowered, bit reduction is made preferentially for one of the main information and the subsidiary information, the sound quality is lowered significantly. For this reason, it becomes necessary to reduce not only the main information but also the subsidiary information as well.

SUMMARY OF THE INVENTION

In view of the above-depicted status of the art, it is a principal object of the present invention to provide digital signal processing methods and apparatus in which a sampling frequency signal generating circuit is uncomplicated and the LSI scale need not be increased as a result of the provision of plural bit rate modes.

It is a second object of the present invention to provide a compressed data recording/reproducing apparatus in which bit-compressed data from a recording media such as a magneto-optical disc or an optical disc may be dubbed with a reduced amount of arithmetic-logical operations or where the bit-compressed data may be reproduced from another recording medium such as an IC card with a reduced amount of arithmetic-logical operations.

It is a third object of the present invention to provide a compressed data recording/reproducing apparatus in which it is possible to suppress the volume of the subsidiary information to a necessary minimum value and to thereby decrease the deterioration in the sound quality due to a low bit rate.

With the compressed data recording and/or reproducing apparatus and technique and the recording medium, the same sampling frequency is employed, despite the difference in the bit rate for the respective modes, in order to avoid complexity in the structure of the sampling frequency generating circuit and to avoid an increase in hardware scale resulting from such complexity.

Moreover, the transfer of the information, which it has been difficult to achieve when using different sampling frequencies for the respective modes, may be easily achieved. For example, if it is desired to write the high bit rate mode information from a large-capacity magneto-optical disc onto a small-capacity IC card with a low bit rate mode, low bit rate compression may be realized by only an additional processing operation, without the necessity of annulling the compression mode for reversion to signals in the time domain, such that the volume of the processing operations may be minimized, while also achieving the real-time processing operation. The switching from the low bit rate mode to a bit rate mode with a bit rate at least higher than the low bit rate may be achieved only by format conversion, that is by re-arraying the encoded information data.

According to the present invention, the conversion between different bit rate modes may be performed at a high speed without reversion to time-domain signals by employing the same orthogonal transform block size for respective bit rate modes. In addition, plural blocks for block floating and/or quantization noise affected blocks, which are adjacent to one another along the time scale or the frequency scale, are used in common for diminishing the volume of the subsidiary information as required for the blocks for block floating and/or the quantization noise affected blocks, such as the scale factor or the word length data. Since acoustic signals exhibit high correlation along both the time scale and the frequency scale, there is little effect on the sound quality if the blocks for block floating and/or the quantization noise affected blocks are used in common. If the signals are temporally non-stationary, it is possible to employ a variable orthogonal transform block size for preventing the compression efficiency from being lowered. The bits for the subsidiary information thus deleted may be allocated for the main information. In addition, by changing the group of the subsidiary information to be used in common depending on the orthogonal transform block size, the orthogonal transform block size may be changed, such that the subsidiary information may be used in common in an optimum manner even although the structure of the blocks for block floating or the blocks affected by the quantization noise is changed.

On the other hand, if, with the frequency bandwidth for quantization noise control being the same for all modes irrespective of the frequencies, the frequency range of 20 kHz is divided into 32 bands, the frequency bandwidth is on the order of 700 Hz which is significantly broader than the critical bandwidth of 100 Hz for the lower frequency range. Thus, the frequency bandwidth becomes narrower than the bandwidth of the critical band for the mid to low range, thus significantly lowering the quantization and encoding efficiency. According to the present invention, the frequency bandwidth for quantization noise control is selected to be broader towards the higher frequencies for at least the majority of the frequency bands resulting from division so that the frequency bandwidth for quantization noise control will be closer to the critical bandwidth.

When dubbing the bit-compressed data from the recording medium, such as the magneto-optical disc, onto another recording medium, such as an IC card, the data is dubbed directly or after additional compression without at least performing full bit expansion. If the additional compression is to be performed, re-allocation and re-quantization of data bits is performed in the frequency domain without signal transformation, with data bits being recorded along with the common plural subsidiary data.

With the compressed data recording and/or reproducing apparatus and technique and the recording medium, the same sampling frequency is employed for preventing the sampling frequency generating circuit from being complicated as well as preventing the hardware scale from being increased. The transfer of the information between the modes with different bit rates may be achieved easily without the necessity of complicated operations such as sampling rate conversion. If it is desired to write the high bit rate mode information recorded on a large-capacity magneto-optical disc onto a small-capacity IC card with a low bit rate mode, the low bit rate mode compression may be realized by an additional processing operation for minimizing the increase in the volume of the arithmetic operations, while the operation may also be achieved on the real-time basis. In addition, the lowering of the sound quality may be prevented for the low bit rate mode.

DETAILED DESCRIPTION OF THE PREFERRED EMBODIMENTS

Figure 1:
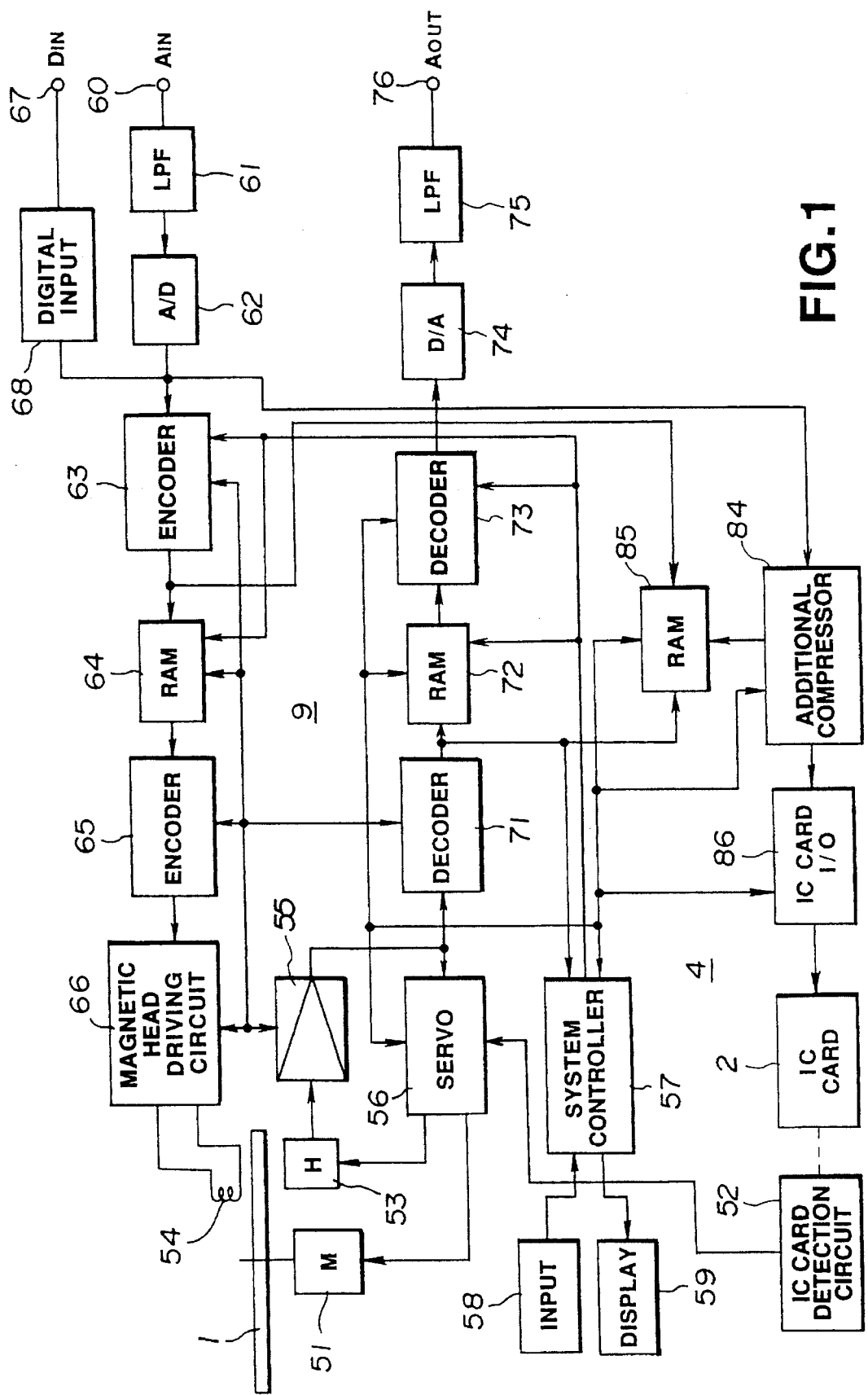
FIG. 1 is a block circuit diagram illustrating an embodiment of a recording and/or reproducing apparatus for compressed data according to the present invention.

Referring to the drawings, illustrative embodiments of the present invention will be explained in detail.

In FIG. 1, there is shown a schematic arrangement of an embodiment of the recording and/or reproducing apparatus for compressed data of the present invention in a block circuit diagram.

The recording/reproducing apparatus shown in FIG. 1 comprises a recording/reproducing unit for a magneto-optical disc 1 as one of the recording media and a recording unit for an IC card 2, as another recording medium, with the two units arranged into one system. When recording signals reproduced from the magneto-optical disc 1 by the reproducing portion of the recording/reproducing unit for the magneto-optical disc onto the IC card 2 (by the recording portion of the recording/reproducing unit for the IC card 2), reproduced compressed data read by an optical head 53 from the magneto-optical disc 1 of the reproducing side and sent to a decoder 71 for EFM demodulation. The decoder 71 provides deinterleaving and error correction, that is ATC audio data, which is sent to a memory 85 of the IC card recording unit. The ATC audio data is processed by adding a variable bit rate encoding window by an additional compressor 84. The additional compressor 84 performs an additional operation of entropy coding for the memory 85. The ATC audio data is then recorded on the IC card 2 via an IC card interfacing circuit 86. In this manner, the reproduced compressed data is transmitted to the recording system for recording on the IC card 2 in a compressed state prior to expansion by an ATC decoder 73.

Meanwhile, for usual audio reproduction, compressed data is read from the recording medium (magneto-optical disc 1)intermittently or in a burst fashion with a pre-set amount of data, for example, 32+several sectors, as a unit, and is expanded for conversion into continuous audio signals. During dubbing, compressed data on the recording medium is continuously read and transmitted to the recording system for recording. In this manner, high-speed or short-term dubbing may be performed depending on the data compression ratio.

The arrangement shown in FIG. 1 is now explained in further detail. In the magneto-optical disc recording/replay unit of the compressed data recording and/or reproducing apparatus, shown in FIG. 1, the magneto-optical disc 1, which is rotated by a spindle motor 51, is employed as a recording medium. To record data onto the magneto-optical disc 1, a modulated magnetic field corresponding to the recording data is applied by a magnetic head 54, while the magneto-optical disc 1 is irradiated with a laser light beam by the optical head 53. In reproducing the recorded data, a recording track on the magneto-optical disc 1 is traced by a laser light beam for reproduction photomagnetically.

The following description is directed mainly to the recording/replay apparatus. The optical head 53 is made up of a laser light source, such as a laser diode, optical components, such as a collimator lens, an objective lens, a polarized light beam splitter or a cylindrical lens, and a photodetector which includes a light receiving section having a pre-set pattern. The optical head 53 is placed at a position facing the magnetic head 54 with the magneto-optical disc 1 in-between. For recording data on the magneto-optical disc 1, the magnetic head 54 is driven by a head driving circuit 66 of a recording system, as explained later herein, for applying a modulated magnetic field corresponding to the recording data to the disc 1, while a laser light beam is radiated by the optical head 53 onto a target track of the magneto-optical disc 1 for thermo-magnetic recording in accordance with magnetic field modulation. In addition, the optical head 53 detects the reflected laser light from the target track in order to detect focusing error by an astigmatic method and in order to determine tracking error by a push-pull method. When reproducing data from the magneto-optical disc 1, the optical head 53, in addition to detecting the focusing error and/or the tracking error, also detects the difference in the angle of polarization (the Kerr rotation angle) of the reflected light from the target track in order to generate playback signals.

An output of the optical head 53 is supplied to an RF circuit 55 which extracts the above-mentioned focusing error signals and the tracking error signals from the output. These extracted signals are transmitted to a servo control circuit 56. The RF circuit 55 also converts the playback signals into bi-level signals which are supplied to a decoder 71 of the reproducing system as later explained herein.

The servo control circuit 56 is made up of, for example, a focusing servo control circuit, a tracking servo control circuit, a spindle servo control circuit, a thread servo control circuit and so forth. The focusing servo control circuit focusing-controls the optical system of the optical head 53 so that the focusing signal is reduced to zero. The tracking servo control circuit controls the optical system of the optical head 53 so that the tracking signal is reduced to zero. The spindle motor servo controlling circuit controls the spindle motor 51 for running the magneto-optical disc 1 into rotation at a pre-set rotational velocity, for example, at a constant linear velocity. The thread servo control circuit shifts the optical head 53 and the magnetic head 54 to a target track position of the magneto-optical disc 1 as designated by a system controller 57. The servo control circuit 56 transmits information indicating the operating states of the various components controlled by the servo control circuit 56 to the system controller 57.

A key input unit 58 and a display 59 are connected to the system controller 57 which controls the recording system and the reproducing system under an operating mode as designated by input information entered at the key input unit 58. The system controller 57 also supervises the recording position and the replay position on the recording track traced by the optical head 53 and the magnetic head 54 based upon the sector-based address information from Q-data, such as header time or sub-code data which is recorded on the magneto-optical disc 1. In addition, the system controller 57 causes the bit compression mode to be displayed on the display 59, based on the bit compression mode information at an encoder 63, as selected by the key input unit 58 (as later explained), and on the compression mode information in the replay data as obtained from the RF circuit 55 via a replay system (as later explained), while causing the replay time to be displayed on the display 59 based on the data compression ratio in the bit compression mode and the playback position information on the recording track.

For playback time display, the sector-based address information (absolute time information) reproduced from header time or sub-code Q data from the recording track of the magneto-optical disc 1 is multiplied by a reciprocal of the data compression ratio for the bit compression mode, such as 4 for the bit compression ratio of ¼, to determine the actual time information, which is displayed on the display 9. Meanwhile, during recording, if the absolute time information is pre-recorded on the recording track of the magneto-optical disc 1, that is, if the magneto-optical disc 1 is pre-formatted, it is possible to display the actual recording time by reading the pre-formatted absolute time information and multiplying it with a reciprocal of the data compression ratio.

In a recording system of the present disc recording/reproducing apparatus, analog audio input signals AIN are supplied from an input terminal 60 via a low-pass filter 61 to an A/D converter 62 which quantizes the analog audio input signals AIN. The digital audio input signals from the A/D converter 62 are supplied to an adaptive transform coding (ATC) PCM encoder 63. Alternatively, digital audio input signals DIN from an input terminal 67 is supplied to the ATC encoder 63 via a digital input interfacing circuit 68. The ATC encoder 63 performs bit compression (data compression), in accordance with the various modes of the ATC system as shown in Table 1. Such bit compression is performed, on the digital audio PCM data (which is the above-mentioned input signal AIN as quantized by the A/D converter 62) at a pre-set transfer rate, which is the above-mentioned input signal AIN as quantized by the A/D converter 62. The ATC encoder 63 has its operating mode designated by the system controller 57. For the B-mode, as an example, the data is the compressed data having the sampling frequency of 44.1 kHz and the bit rate of 64 kbps (ATC data) and is supplied to a memory 64. The data transfer rate for the stereo B mode is reduced to one-eighth of the data transfer rate for the standard CD-DA format of 75 sectors per sec, or to 9.375 sectors per sec.

TABLE 1

| | SAMPLING FREQUENCY = 44.1 kHz | | |
|---|---|---|---|
| MODE | BIT RATE kbps/channel | BANDWIDTH kHz | MAXIMUM PROCESSING BLOCK LENGTH msec |
| A | 128 | 22 | 11.6 |
| B | 64 | 13 | 23.2 |
| C | 32 | 5.5 | 34.8 |
| D | 16 | 3 | 46.4 |

In the embodiment of FIG. 1, it is assumed that the sampling frequency of the A/D converter 62 is fixed at the sampling frequency of the standard CD-DA format (44.1 kHz), and that the sampling frequency is maintained in the ATC encoder 63 to perform bit compression. Since the lower the bit rate of the mode, the narrower becomes the signal pass band, the cut-off frequency of the low-pass filter 61 is adjusted in a corresponding manner. That is, it suffices to control the cut-off frequency of the low-pass filter 61 of the A/D converter 62 depending on the compression mode.

The memory 64 is a buffer memory having its data writing and data reading controlled by the system controller 57. The memory 64 transiently stores ATC data supplied from the ATC encoder 63 for recording on the disc when the necessity arises. That is, for the stereo B mode, the compressed audio data supplied from the ATC encoder 63 has its data transfer rate diminished to one-eighth of the data transfer rate for the standard CD-DA format of 75 sector per sec, or to 9.375 sectors per sec. The compressed data is written continuously on the memory 64. Although it suffices to record the compressed data (ATC data) at a rate of one per eight sectors, as mentioned above, such recording at every eight sectors is practically impossible, so that sector-continuous recording is performed, as later explained. This recording is performed in a burst fashion at the data transfer rate of 75 sectors per sec, which is the same as the standard CD-DA format, with a cluster made up of pre-set plural sectors, for example, 32+several sectors, as a recording unit, with the interposition of a non-recording period. That is, in the memory 64, the stereo B mode ATC audio data, continuously written at a low transfer rate of 9.375 (=75/8) sectors per sec associated with the bit compression mode, is read as the recorded data in a burst fashion at the above-mentioned transfer rate of 75 sectors per sec. The overall data transfer rate of the data read out and recorded, inclusive of the non-recording period, is the low rate of 9.375 sectors per sec. However, the instantaneous data transfer rate within the time period of the recording operation performed in a burst fashion is the above-mentioned standard data transfer rate of 75 sectors per sec. Therefore, if the disc rotating velocity is the same as that of the standard CD-DA format, that is a constant linear velocity, recording is made at the same recording density and with the same recording pattern as those of the CD-DA format.

The ATC audio data to be recorded is read from the memory 64 at the above-mentioned instantaneous transfer rate of 75 sectors per sec and supplied to an encoder 65. The recording unit by which the data string supplied from the memory 64 to the encoder 65 is a cluster consisting of plural sectors, such as 32 sectors, and several cluster-linking sectors arrayed ahead and at back of the cluster. The cluster-linking sectors are selected to be longer than an interleaving length at the encoder 65 so that data of neighboring clusters are not affected by data interleaving.

The encoder 65 performs encoding for error correction, such as parity appendage and data interleaving, or EFM encoding, on the recording data which is supplied from the memory 64 in the burst fashion. The recorded data encoded by the encoder 65 is then supplied to a magnetic head driving circuit 66. The magnetic head 54 is connected to and driven by the magnetic head driving circuit 66 to apply to the magneto-optical disc 1 a modulated magnetic field corresponding to the recorded data.

The system controller 57, in addition to controlling the memory 64 as described above, also controls the recording position in such a manner that the recorded data read in the burst fashion from the memory 64 is continuously recorded on the recording track of the magneto-optical disc 1. The recording position is controlled by supervising the recording position of the recorded data read in the burst fashion by the system controller 57 from the memory 64 and by supplying a control signal designating the recording position on the recording track of the magneto-optical disc 1 to the servo control circuit 56.

The reproducing system of the recording/reproducing unit for the magneto-optical disc 1 is hereinafter explained. The reproducing system is employed for reproducing the recorded data continuously recorded on the recording track of the magneto-optical disc 1. The reproducing system includes a decoder 71, to which is provided a playback output. The playback output is produced by tracing the recording track of the magneto-optical disc 1 with a laser light beam from the optical head 53. The reflected laser light beam is sensed by the optical head 53 and is converted into bi-level data by the RF circuit 55. Recorded data may be read not only from the magneto-optical disc 1 but also from the read-only (or playback-only) optical disc of the same type as the so-called compact disc.

The decoder 71 is a counterpart of the encoder 65 of the above-described recording system and performs the above-mentioned decoding for error correction or EFM decoding on the bi-level playback output of the RF circuit 55. The decoder 71 also reproduces the stereo B mode ATC audio data at a transfer rate of 75 sectors per second, which is faster than the normal transfer rate for the stereo B mode. The playback data obtained by the decoder 71 is supplied to a memory 72.

The memory 72 has its data writing and reading controlled by the system controller 57 in such a manner that the playback data supplied from the decoder 71 at the transfer rate of 75 sectors per sec is written therein in the burst fashion at the transfer rate of 75 sectors per sec. Such playback data, which is written in the burst fashion at the transfer rate of 75 sectors per sec in the memory 72, is continuously read from the memory 72 at the normal transfer rate for the stereo B mode of 9.375 sectors per sec.

The system controller 57 controls the memory 72 in such a manner as to write the replay data into the memory 72 at the transfer rate of 75 sectors per sec and to continuously read the replay data from the memory 72 at the above-mentioned transfer rate of 9.375 sectors per sec. The system controller 57, while controlling the memory 72 as described above, controls the replay position such that the replay data which is written in a burst fashion into the memory 72 under control by the system controller 57, is continuously reproduced from the recording track of the magneto-optical disc 1. The replay position is controlled such that the replay position for the replay data is supervised by the system controller 57 and a control signal designating the replay position on the recording track of the magneto-optical disc 1 or the optical disc is transmitted to the servo control circuit 56.

The stereo B mode ATC audio data obtained as the replay data continuously read from the memory 72 at the transfer rate of 9.375 sectors per sec is supplied to an ATC decoder 73. The ATC decoder 73 is a counterpart of the ATC encoder 63 of the recording system. The ATC decoder 73 and has its operating mode designated by the system controller 57 in such a manner that the stereo B mode ATC data, for example, is expanded by a factor of eight by way of bit expansion for reproducing 16-bit digital audio data. The digital audio data from the ATC decoder 73 is supplied to a D/A converter 74.

The D/A converter 74 translates the digital audio data supplied from the ATC decoder 73 into analog signals for forming analog audio output signals AOUT. The analog audio output signals AOUT are outputted at an output terminal 76 via a low-pass filter 75.

The above-mentioned IC card recording unit of the compressed data recording and/or reproducing apparatus is hereinafter explained. The analog audio input signals AIN from an input terminal 60 are supplied via a low-pass filter 61 to an A/D converter 62 for quantization. The digital audio signals from the A/D converter 62 are supplied to an additional compressor 84 which is a type of variable bit rate encoder performing a so-called entropy encoding. Thus, the entropy encoding by the additional compression unit 84 is performed as data is written in or read from the memory 85. The data from the additional compression unit 84, compressed and encoded at the variable bit rate for entropy coding, is recorded on the IC card 2 via an IC card interfacing circuit 86. It is, of course, possible with the present invention to effect a constant low bit rate recording by increasing the block size of the orthogonal transform or enlarging the frequency width of a frequency-domain block for block floating having the subsidiary information concerning the quantization and/or a block affected by the quantization noise instead of performing variable bit rate compression such as the entropy coding.

Meanwhile, the compressed data (ATC data) from the decoder 71 of the replay system of the recording/reproducing unit for the magneto-optical disc 1 is transmitted without expansion, that is, transmitted directly to the memory 85 of the IC card recording unit 4. Such data transfer is performed under control of the memory 85 by the system controller 57 during the so-called high-speed dubbing. It is also possible to transmit the compressed data from the memory 72 to the memory 85. Recording from the magneto-optical disc or the optical disc onto an IC card by changing the bit rate mode and by lowering the bit rate is suitable for recording on the IC card having high costs per a unit recording capacity. This is desireable because it is not accompanied by frequency conversion in which the sampling frequency need not be the same irrespective of the prevailing bit rate mode. Actual additional compression is performed in the additional compression unit 84.

The so-called high-speed digital dubbing operation is now explained. During high-speed digital dubbing, a dubbing key of the key input unit 58 is actuated for executing a pre-set high-speed dubbing under instructions issued from the system controller 57. Specifically, compressed data from decoder 71 is directly transmitted to the memory 85 of the IC card recording system and then processed with a variable bit rate encoding by the additional compression unit 84. The encoded data is then recorded on the IC card 2 via the IC card interfacing circuit 86. If the stereo B mode ATC audio data is recorded on the magneto-optical disc 1, data compressed by a factor of eight is continuously read from the decoder 71.

Consequently, during the high speed dubbing, compressed data corresponding to a duration eight times as long as the steady-state time duration on the real time basis for the stereo B mode is continuously produced from the magneto-optical disc 1. This compressed data is entropy coded or coded at a low constant bit rate for recording onto the IC card, so that a high dubbing speed eight times as high as the steady-state dubbing speed is achieved. Meanwhile, the multiplication factor in the high-speed dubbing differs with different compression modes. High-speed dubbing at a rate higher than the multiplication factor used for compression may also be performed, in which case the magneto-optical disc 1 is rotationally driven at a velocity a plurality of times faster than the steady-state velocity.

Figure 2:
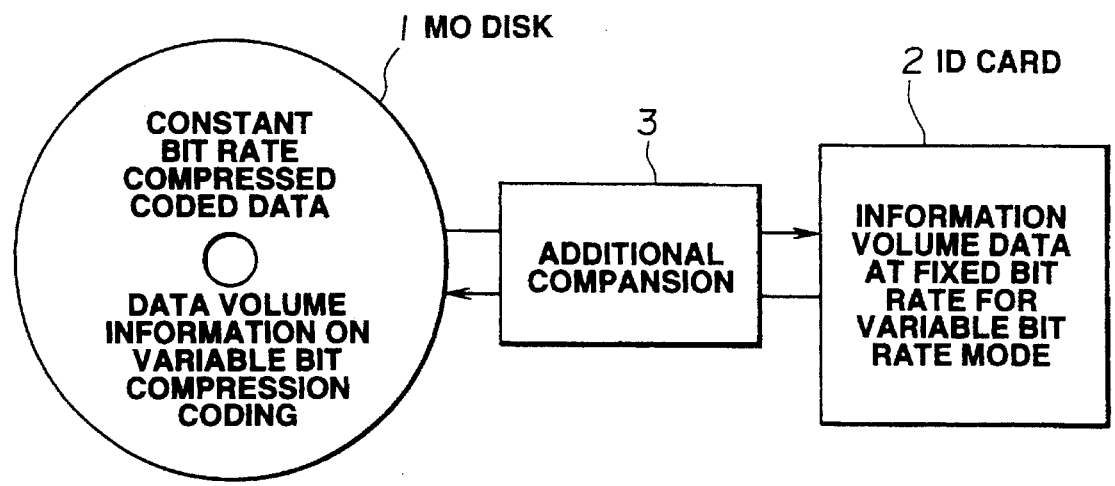
FIG. 2 illustrates the recording contents of a magneto-optical disc and an IC card.

It is noted that not only is the data compressed and encoded at a constant bit rate recorded onto the magneto-optical disc 1, but also recorded is the information concerning the data volume at the time of variable rate compression and encoding of the data by the additional companding block 3, as shown in FIG. 2. By so doing, the number of the musical numbers recorded on the magneto-optical disc 1 and recordable on the IC card 2, as well as the combinations of the musical numbers recordable on the IC card 2, may be instantly known by reading the data volume information. The additional compression from the fixed bit rate to a lower bit rate mode may be performed in the additional companding block 84 in addition to entropy coding to the variable bit rate data.

Conversely, if the information concerning the data volume at the time of bit compression encoding at the constant bit rate, as well as the data compressed by bit compression and encoding at the variable bit rate, is recorded on the IC card 2, the data volume at the time of transmitting data, such as musical numbers, from the IC card 2 to the magneto-optical disc 1, may be known promptly. It is of course possible to record the data compressed and encoded at a fixed bit rate in the IC card 2 in addition to the data compressed and encoded at a variable bit rate.

Figure 3:
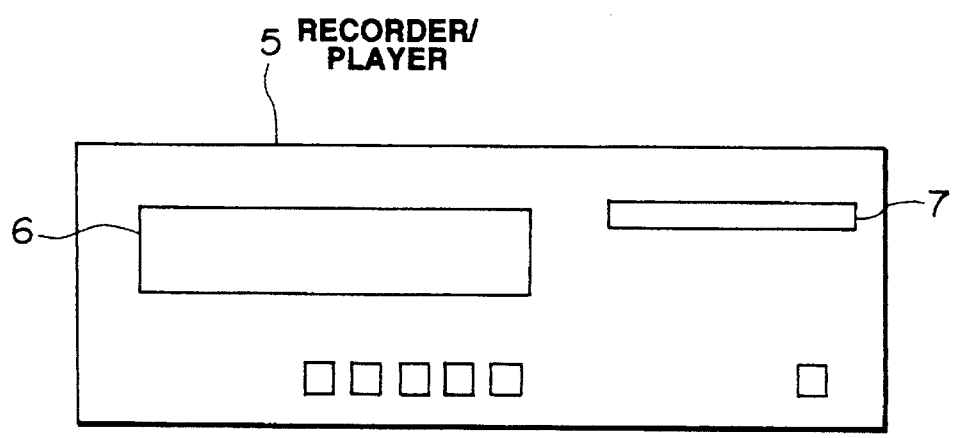
FIG. 3 is a schematic front view showing an example of the apparatus shown in FIG. 1.

FIG. 3 shows, in a front view, the compressed data recording/reproducing apparatus 5, arranged and constructed as shown in FIG. 1. The apparatus 5 has an insertion section 6 for a magneto-optical disc or an optical disc and an insertion slot for an IC card 7. The disc and the IC card may be arranged separately from each other and interconnected by a cable (not shown).

The high efficiency compression and encoding is now explained in detail. That is, the technique of performing high efficiency encoding on input digital signals, such as audio PCM signals, by sub-band coding (SBC), adaptive transform coding (ATC) and adaptive bit allocation, is explained by referring first to FIG. 4.

Figure 4:
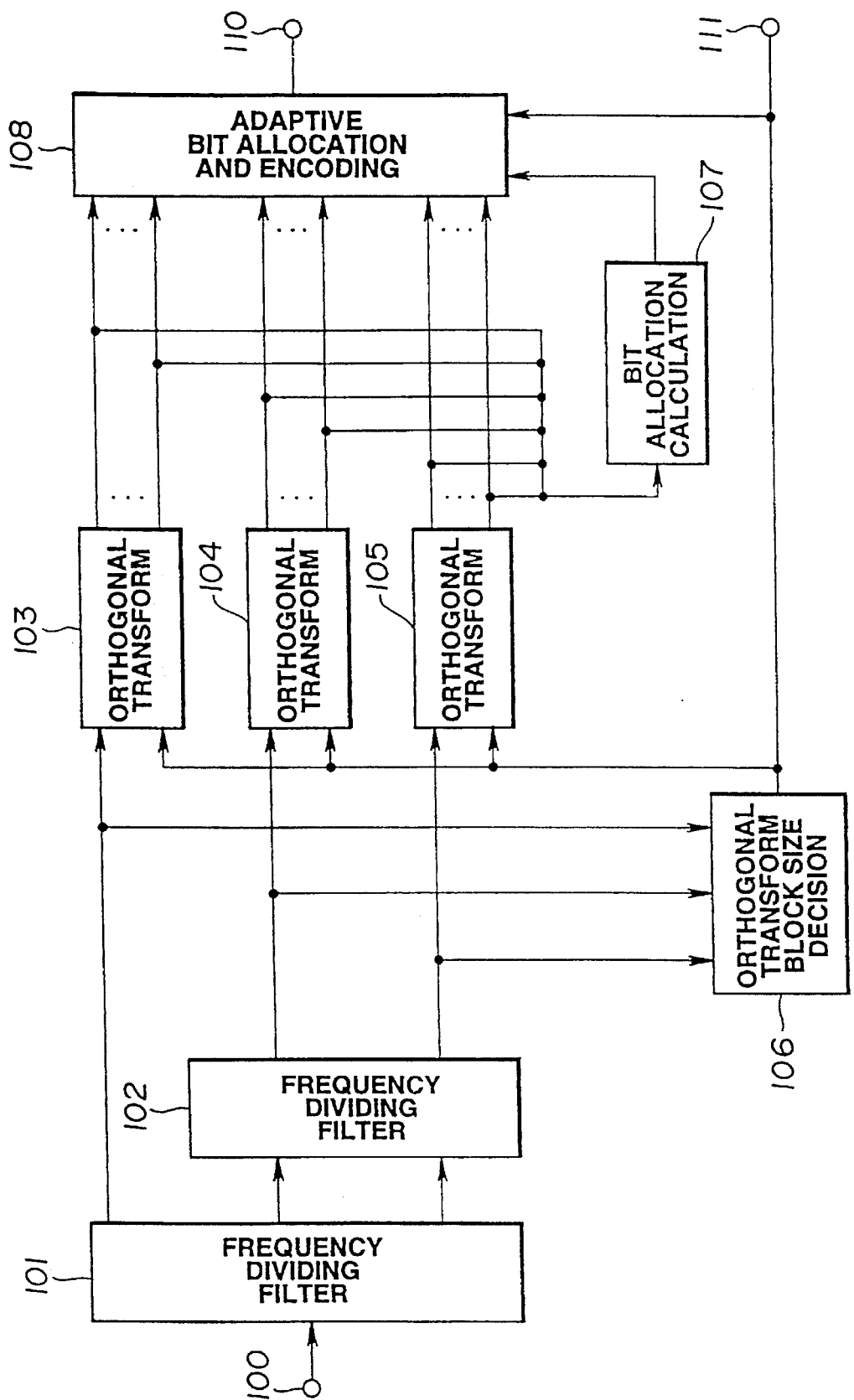
FIG. 4 is a block circuit diagram showing an embodiment of an encoding apparatus for implementing the high efficiency encoding technique for audio data according to the embodiment shown in FIG. 1.

In the high-efficiency encoding apparatus, shown in FIG. 4, the frequency range of the input digital signals is divided into plural frequency bands so that two neighboring lower most bands are of an equal bandwidth and the bandwidths become progressively broader in the direction of increasing frequencies. The input digital signals are orthogonally transformed from one frequency band to another to produce frequency-domain spectral data which is encoded with the numbers of bits which are adaptively allocated on the basis of so-called critical bands for the lower frequency range. Such adaptive allocation takes into account the characteristics of human aural sense, as later explained herein. In addition, smaller width bands are sub-divided from the critical bands for the higher frequency range in order to raise the block floating efficiency. This block usually becomes the block subject to the quantization noise, that is the block based on which the quantization noise is produced. In addition, with the present embodiment, the block size or block length is adaptively changed prior to orthogonal transform depending on input signals and floating is performed on the block basis.

Referring to FIG. 4, audio PCM signals having a frequency range of 0 to 22 kHz, with the sampling frequency of 44.1 kHz, are supplied to an input terminal 100. These input signals are divided by a frequency dividing filter 101, such as, for example, a QMF filter, into signals having a frequency range of 0 to 11 kHz and a frequency range of 11 to 22 kHz. The signals having the frequency range of 0 to 11 kHz are similarly divided by a similar frequency dividing filter 102, such as a QMF filter, into signals having a frequency band of 0 to 5.5 kHz and signals having a frequency band of 5.5 kHz to 11 kHz. The signals of the respective bands from the frequency dividing filters 101, 102 are supplied to an orthogonal transform block size decision circuit 106 for determining the block size on the band basis. With the orthogonal transform block size decision circuit 106, the block size length is based on, for example, the length of 11.6 ms which is the maximum block size. If the signals are temporally sub-stationary, the orthogonal transform block size is set to its maximum value of 11.6 ms for raising the frequency resolution. If the signals are temporally non-stationary, the orthogonal transform block size is further divided into four and eight sections for the frequency band not higher than 11 kHz and the frequency band higher than 11 kHz, respectively, for improving time resolution.

Among the techniques of dividing the above-mentioned input digital signals into plural frequency bands, there is a QMF filter, for example, as discussed in Digital Coding of Speech in Sub-bands, R. E. Crochiere, Bell Syst. Tech. J., Vol. 55 No. 8, 1976. The technique of filter division into equal bandwidths is discussed in Polyphase Quadrature Filters—A New Sub-band Coding Technique, Joseph H. Rothweiler, ICASSP 1983, Boston.

Referring again to FIG. 4, outputs of the frequency dividing filters 101, 102 of the respective frequency bands are separately supplied to the orthogonal transform circuits

Figure 5:
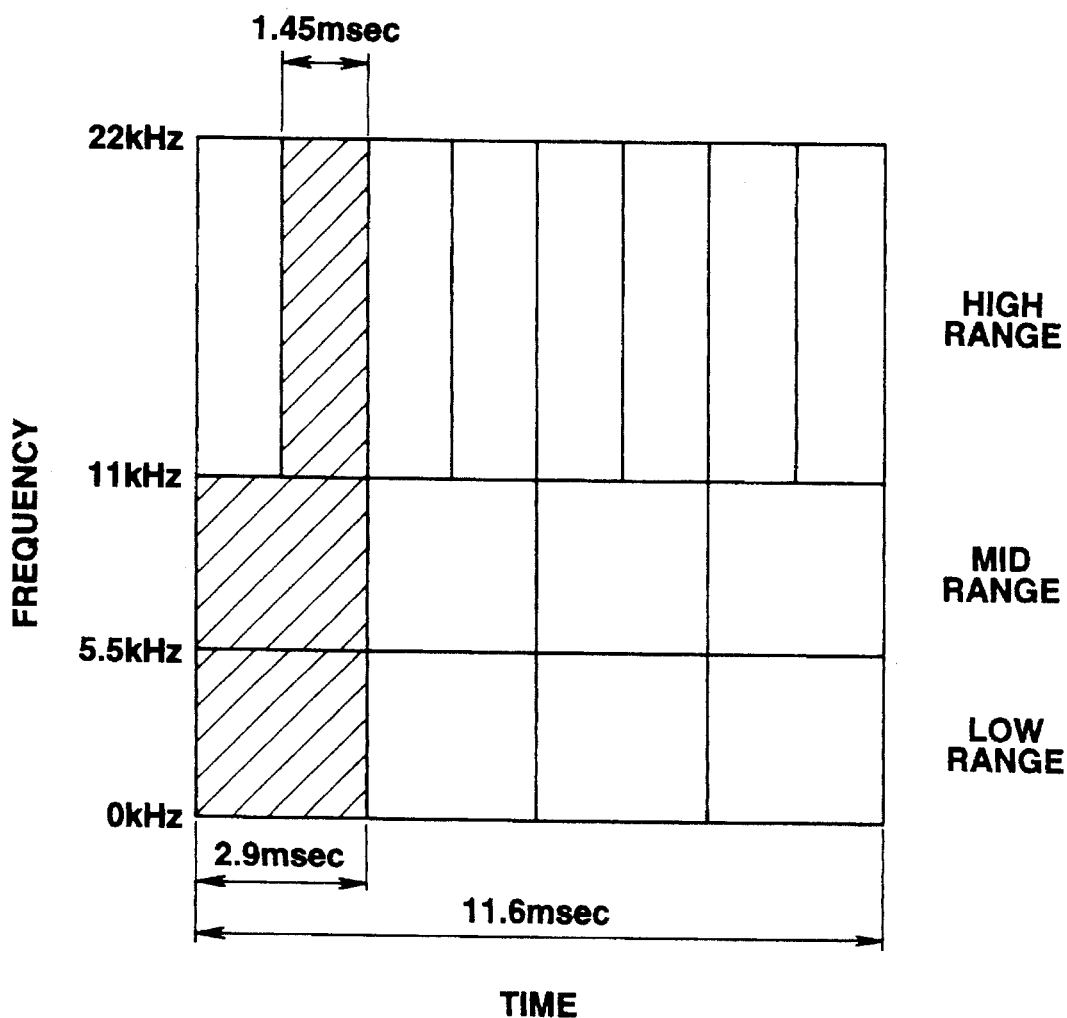
FIG. 5 is a diagrammatic view for illustrating the block size for orthogonal transform for the embodiment shown in FIG. 1.

103, 104 and 105. The block sizes determined by the orthogonal transform size decision circuit 106 are supplied to the orthogonal transform circuits 103 to 105, outputs of which are blocked, that is formed into blocks, depending on the block sizes, for orthogonal transform. FIG. 5 shows the orthogonal transform block sizes. Thus the block size of 11.6 ms (long mode) or the block size of 2.9 ms (short mode) is selected for the low to mid frequency range and the block size of 11.6 ms (long mode) or 1.45 ms (short mode) is selected for the high frequency range. The selected block size is outputted at a terminal 111 and thence supplied to the decoding circuit.

As an examples of the above-described orthogonal transform, there is such orthogonal transform in which input audio signals are divided into time blocks of pre-set length (frames) and processed with fast Fourier transform (FFT), cosine transform (DCT) or modified DCT (MDCT) for transformation of time-domain signals into frequency-domain signals. Discussions on MDCT may be found in Sub-band/Transform Coding Using Filter Bank Designs Based on Time Domain Aliasing Cancellation, J. P. Princen, A. B. Bradley, ICASSP 1987, Univ. of Surrey, Royal Melbourne Inst. of Tech.

The bit allocation calculating circuit 107 calculates, in view of the masking effect, the amounts of masking for each critical band and each band divided from the critical band to take into account the block floating based on the spectral data divided to take into account the above-mentioned critical bands and block floating. In addition, the bit allocation calculating circuit 20 calculates the numbers of allocated bits for the respective bands, based upon the energies or peak values for each of the critical bands and the bands divided from the critical bands to take the block floating into account, and on the amounts of masking, and transmits the resulting information to the adaptive bit allocation and encoding circuit 108. The adaptive bit allocation and encoding circuit 108 requantizes the spectral data or the MDCT coefficient data depending on the numbers of bits allocated to the respective bands in the bit allocation calculating circuit 107. The data encoded in this manner is outputted at an output terminal 110.

Figure 6:
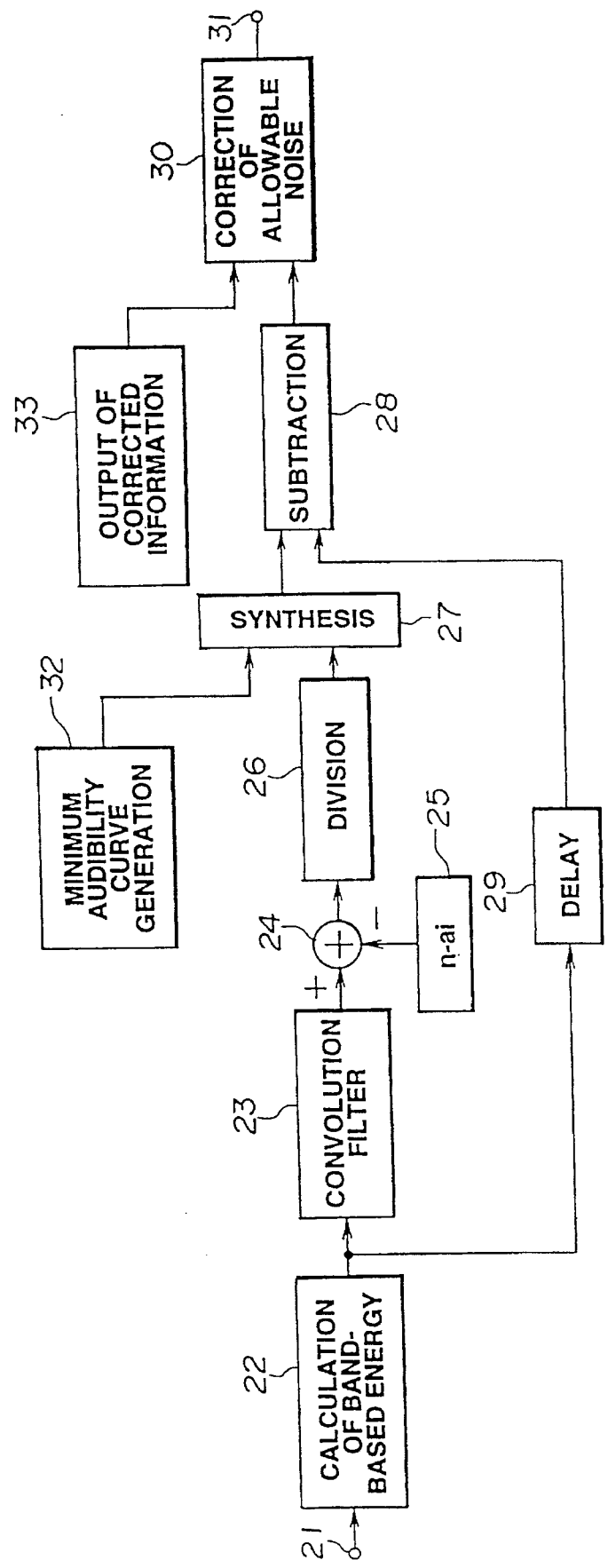
FIG. 6 is a block circuit diagram for illustrating the structure for implementing the bit allocation and arithmetic-logical function.

FIG. 6 shows, in a schematic block circuit diagram, an arrangement of a concrete embodiment of the bit allocation calculating circuit 107, in which the frequency-domain spectral data from the MDCT circuits 103 to 105 are supplied to an input terminal 21.

Figure 7:
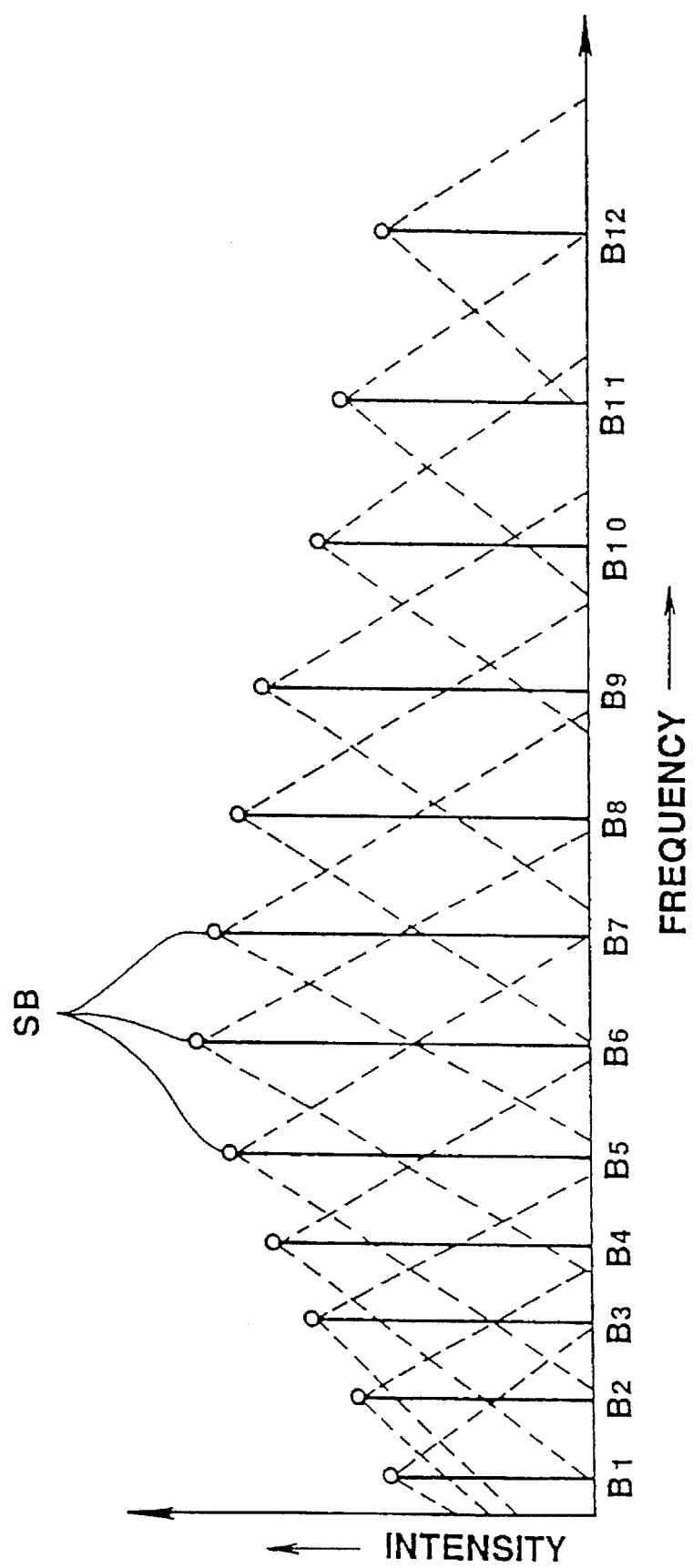
FIG. 7 is a graph showing the spectrum of the critical bands and the bands which have been divided to take block floating into account.

The frequency-domain input data is transmitted to a band-based energy calculating circuit 22. The band-based energy calculating circuit 22 calculates the sum total of the amplitudes in each respective band. Each sum total is corrected by taking into account the masking, the critical bands and the block floating. High frequency bands and low frequency bands each include critical bands. The amplitude peak values or mean values may also be employed in place of the energies in the respective bands. Each spectral component indicating the sum value of the amplitudes of each of the respective bands is indicated as SB in FIG. 7 as an output of the energy calculating circuit 22. In FIG. 7, 12 bands B1 to B12 are shown as indicating the critical bands and the bands sub-divided from the critical bands to take into account the block floating, and the amounts of masking, for simplifying the drawing.

It is noted that an operation of multiplying each spectral component SB by a pre-set weighting function for taking into account the effects of masking is now performed by way of convolution. To this end, an output of the band-based energy calculating circuit 22, that is, each value of the spectral component SB, is transmitted to a convolution filter circuit 23. The convolution filter circuit 23 is made up of a plurality of delay elements for sequentially delaying input data, a plurality of multipliers, such as 25 multipliers associated with the respective bands, for multiplying outputs of the delay elements with filter coefficients or weighting functions, and an adder for finding the sum of the outputs of the respective multipliers. By such convolution, the sum of the portions indicated by broken lines in FIG. 7 is found. "Masking" means the phenomenon in which certain signals are masked by other signals and become inaudible due to characteristics of the human aural sense. The masking effect may be classified into time-domain masking effect produced by the time-domain audio signals and concurrent masking effect produced by the frequency-domain signals. By this masking, any noise present in a masked portion becomes inaudible. In actual audio signals, the noise within the masked range is an allowable noise.

By way of a concrete example of multiplication coefficients or filter coefficients of the respective filters of the convolution filter circuit 23, if the coefficient of a multiplier M for an arbitrary band is 1, outputs of the delay elements are multiplied by coefficients 0.15, 0.0019, 0.0000086, 0.4, 0.06 and 0.007 at the multipliers M−1, M−2, M−3, M+1, M+2 and M+3, M being an arbitrary integer of from 1 to 25, for performing convolution of the spectral components SB.

An output of the convolution filter circuit 23 is transmitted to a subtractor 24 for finding a level $\alpha$ corresponding to the allowable noise level in the convolved region. Meanwhile, the allowable noise level $\alpha$ is such a level which will give an allowable noise level for each of the critical bands by deconvolution as will be described subsequently. The subtractor 24 is supplied with an allowance function (a function representative of the masking level) for finding the level $\alpha$. The level $\alpha$ is controlled by increasing or decreasing the allowance function. The allowance function is supplied from a (n—ai) function generator 25 which is now explained.

That is, the level $\alpha$ corresponding to the allowable noise level is found from the equation (1):

$$\alpha = S - (n - ai) \qquad (1)$$

where i is the number accorded sequentially to the critical bands beginning from the lower side, n and a are constants where a>0 and S the intensity of the convolved Bark spectrum. In the equation (1), (n—ai) represents the allowance function. In the present embodiment, by setting so that n=38 and a=1, optimum encoding may be achieved without deterioration in the sound quality.

The level $\alpha$ is determined in this manner and transmitted to a divider 26 for deconvolving the level $\alpha$ in the convolved region. By this deconvolution, the masking spectrum is found from the level $\alpha$. This masking spectrum becomes the allowable noise level. Although the deconvolution necessitates complex arithmetic-logical steps, it is performed in the present embodiment in a simplified manner by using the divider 26.

Figure 8:
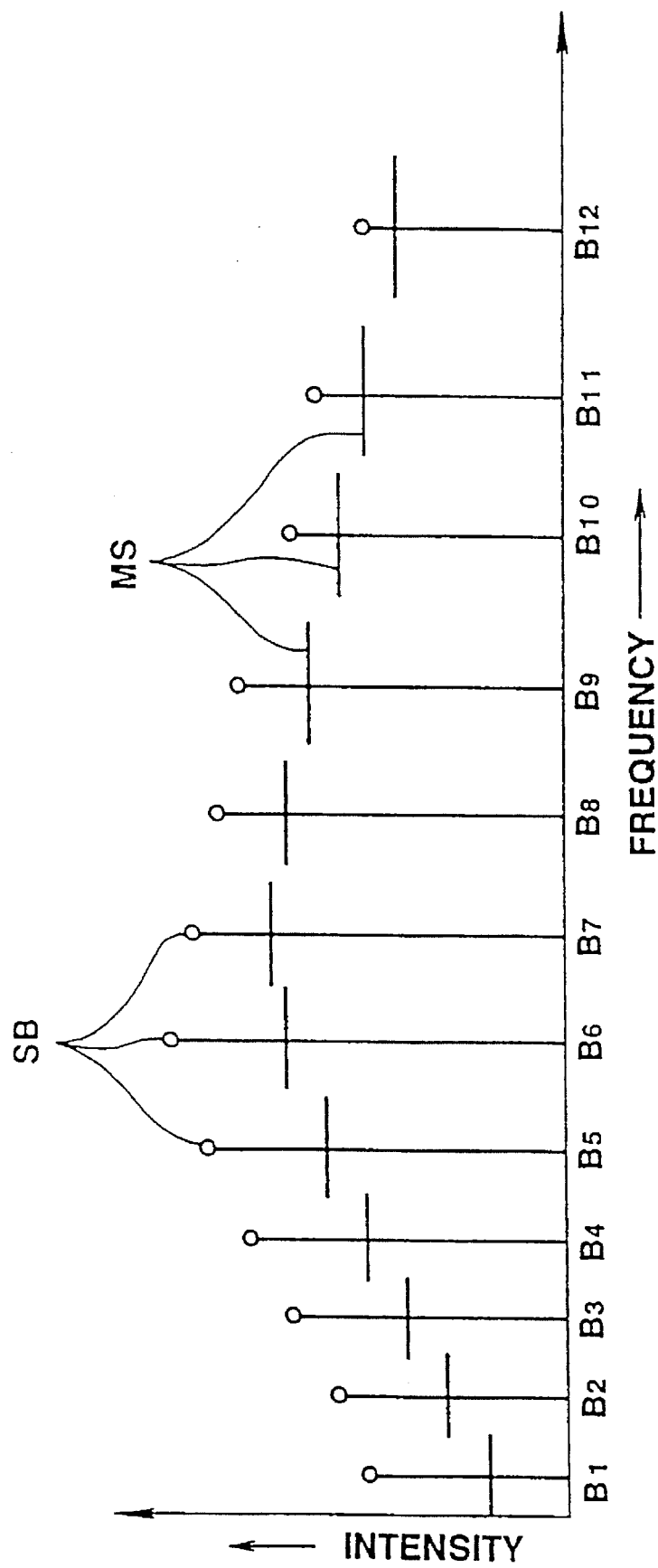
FIG. 8 is a graph showing the relative levels of the masking spectrum in relation to spectral components within a signal spectrum.

The masking spectrum is transmitted via a synthesizing circuit 27 to a subtractor 28 which is supplied with an output of the band-based energy detection circuit 22, that is the above-mentioned spectral components SB. The subtractor 28 subtracts the masking spectrum from the spectrum SB for masking the portions of the spectral components SB lower than the level of the masking spectrum MS, as shown in FIG. 8.

An output of the subtractor 28 is outputted via an allowable noise correction circuit 30 at an output terminal 31 and thence transmitted to a ROM, not shown, in which the information concerning the number of the allocated bits is stored previously. The ROM outputs the information concerning the number of allocated bits for each band, depending on an output of the subtraction circuit 28 supplied via an allowable noise correction circuit 30, that is, depending on the level of a difference between the energies of the respective bands and outputs of the noise level setting means. The information concerning the number of the allocated bits is transmitted to the adaptive bit allocation and encoding circuit 108 to permit the frequency-domain spectral data from the MDCT circuits 103 to 105 to be quantized with the numbers of bits allocated to the respective bands.

In sum, the adaptive bit allocation and encoding circuit 108 quantizes the band-based spectral data with the numbers of bits allocated depending on the amounts of masking and the level of the difference between the output of the noise level setting means and the energies in the critical bands and the bands divided from the critical bands to take the block floating into account. The delay circuit 29 is provided for delaying the spectral components SB from the energy detection circuit 22 in consideration of the delay produced in the circuitry upstream of the synthesizing circuit 27.

Figure 9:
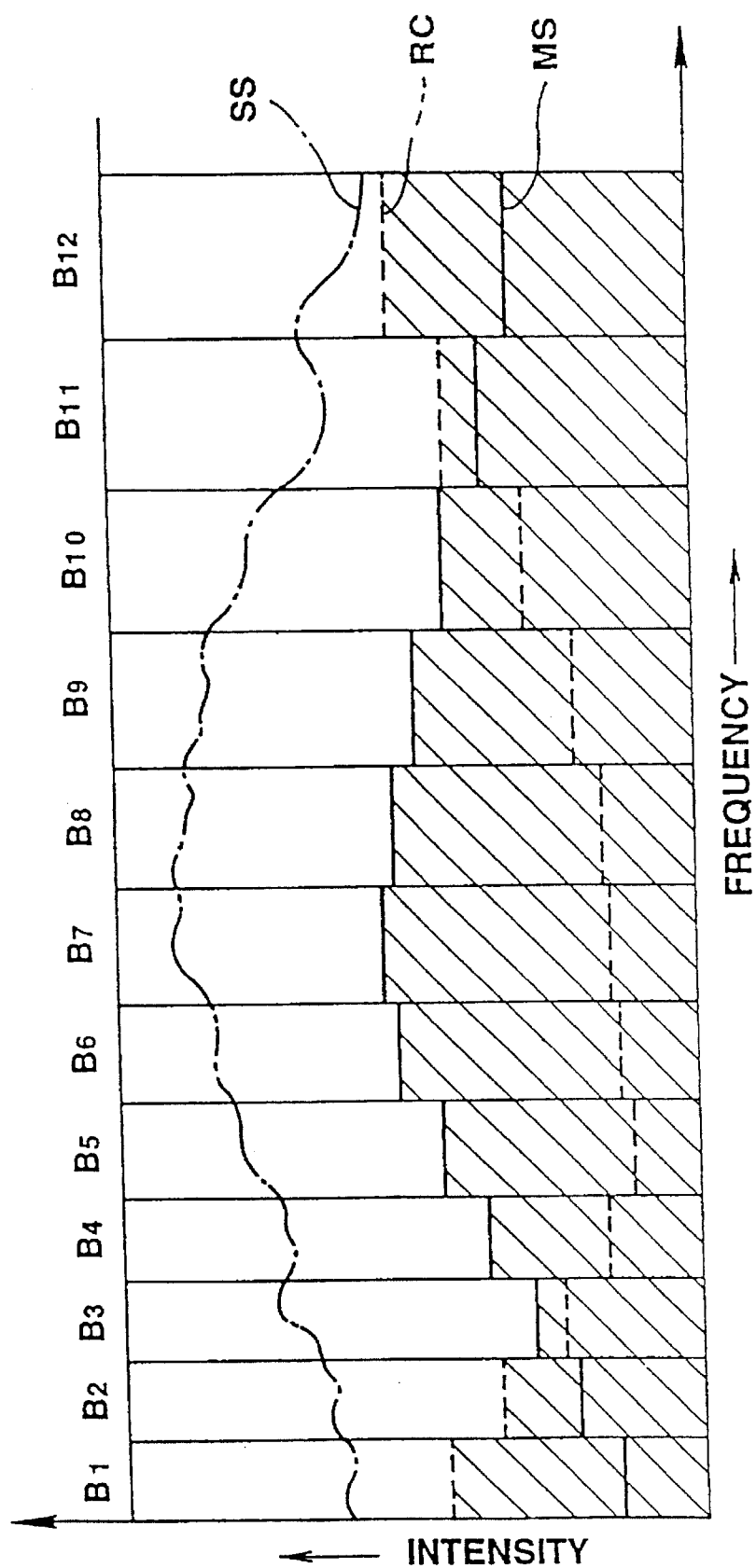
FIG. 9 is a graph showing minimum audibility curve and the masking spectrum combined together.

The synthesizing circuit 27 synthesizes the masking spectrum MS and data from the minimum audibility curve RC from the minimum audibility curve generating circuit 32 representing characteristics of the human aural sense as shown in FIG. 9. If the absolute noise level is lower than the minimum audibility curve, the noise becomes inaudible. The minimum audibility curve differs with the difference in the replay level even although the coding is made in the same manner. However, since there is no marked difference in the manner of entering into the 16-bit dynamic range in music in actual digital systems, it may be presumed that, if the quantization noise of the frequency range in the vicinity of 4 kHz, which frequency is most perceptible to the ear is not heard, the quantization noise lower than the level of the minimum audibility curve is not heard in any other frequency range. Assuming that the recording/replay apparatus is employed so that the noise in the vicinity of 4 kHz (for a word length employed by the system) is not heard, and the allowable noise level is to be obtained by synthesizing the minimum audibility curve RC and the masking spectrum MS, the allowable noise level may be up to the level indicated by hatched lines in FIG. 9. In the present embodiment, the level of 4 kHz of the minimum audibility curve is matched to the minimum level corresponding to, for example, 20 bits. In FIG. 9, the signal spectrum SS is also shown.

In addition, the allowable noise correction circuit 30 corrects the allowable noise level in the output of the subtractor 28 based on the information of the equal-loudness curve transmitted from a correction information outputting circuit 33. The equal-loudness curve is a characteristic curve concerning characteristics of human aural sense, and is obtained by finding the sound pressures of the sound at the respective frequencies heard with the same loudness as the pure tone of 1 kHz and by connecting the sound pressures by a curve. It is also known as an equal loudness sensitivity curve. The equal-loudness curve also delineates a curve which is substantially the same as the minimum audibility curve shown in FIG. 9. With the equal-loudness curve, the sound in the vicinity of 4 kHz is heard with the same loudness as the sound of 1 kHz, even although the sound pressure is decreased by 8 to 10 db from the sound of 1 kHz.

Conversely, the sound in the vicinity of 50 kHz cannot be heard with the same loudness as the sound of 1 kHz unless the sound pressure is higher by about 15 db than that of the sound of 1 kHz. Thus it may be seen that the noise in excess of the level of the minimum audibility curve and within the allowable noise level preferably has frequency characteristics represented by a curve conforming to the equal-loudness curve. Thus it may be seen that correction of the allowable noise level in view of the equal-loudness curve is in conformity to the characteristics of the human aural sense.

Meanwhile, the correction information outputting circuit 33 may be designed to correct the allowable noise level based on the information of the error between the detection output of the volume of the output information (data quantity) at the time of quantization at the adaptive bit allocation and encoding circuit 108 and the target bit rate of the ultimately encoded dam. There are occasions where the total number of bits as obtained by temporary adaptive bit allocation for the totality of the bit allocation unit blocks is different from the pre-set number of bits (target number of the bits) as determined by the bit rate of the ultimate encoded data and hence the bit allocation is again made so that the difference becomes equal to zero. That is, if the total number of allocated bits is less than the target number of the bits, the bits corresponding to the difference are additively allocated to respective unit blocks, whereas, if the total number of allocated bits is larger than the target number of the bits, the bits corresponding to the difference are deductively allocated to the respective unit blocks.

To this end, an error in the total number of allocated bits from the target number is detected and correction data for correcting the number of allocated bits is outputted by the correction information output circuit 33 depending on the error data. If the error data indicates the shortage of the number of bits, it is probable that more bits are employed per unit block so that the amount of the data is in excess of the target number of bits. If the error data indicates an excess of the number of bits, it is probable that a smaller number of bits per unit block suffices so that the amount of the data is less than the target number. Consequently, the correction information outputting circuit 33 is responsive to the error data to output the data of correction values by which the allowable noise level at an output of the subtractor 28 is corrected based on the information of the equal-loudness curve. The correction values are transmitted to the allowable noise correction circuit 30 for correcting the allowable noise from the subtractor 28. With the above-described system, data obtained by processing the orthogonal transform output spectrum by the subsidiary information for quantization is obtained as the main information, while the scale factor indicating the state of block floating or the word length data is produced as subsidiary information for quantization. The main information and the subsidiary information are transmitted from the encoder to the decoder.

Figure 10:
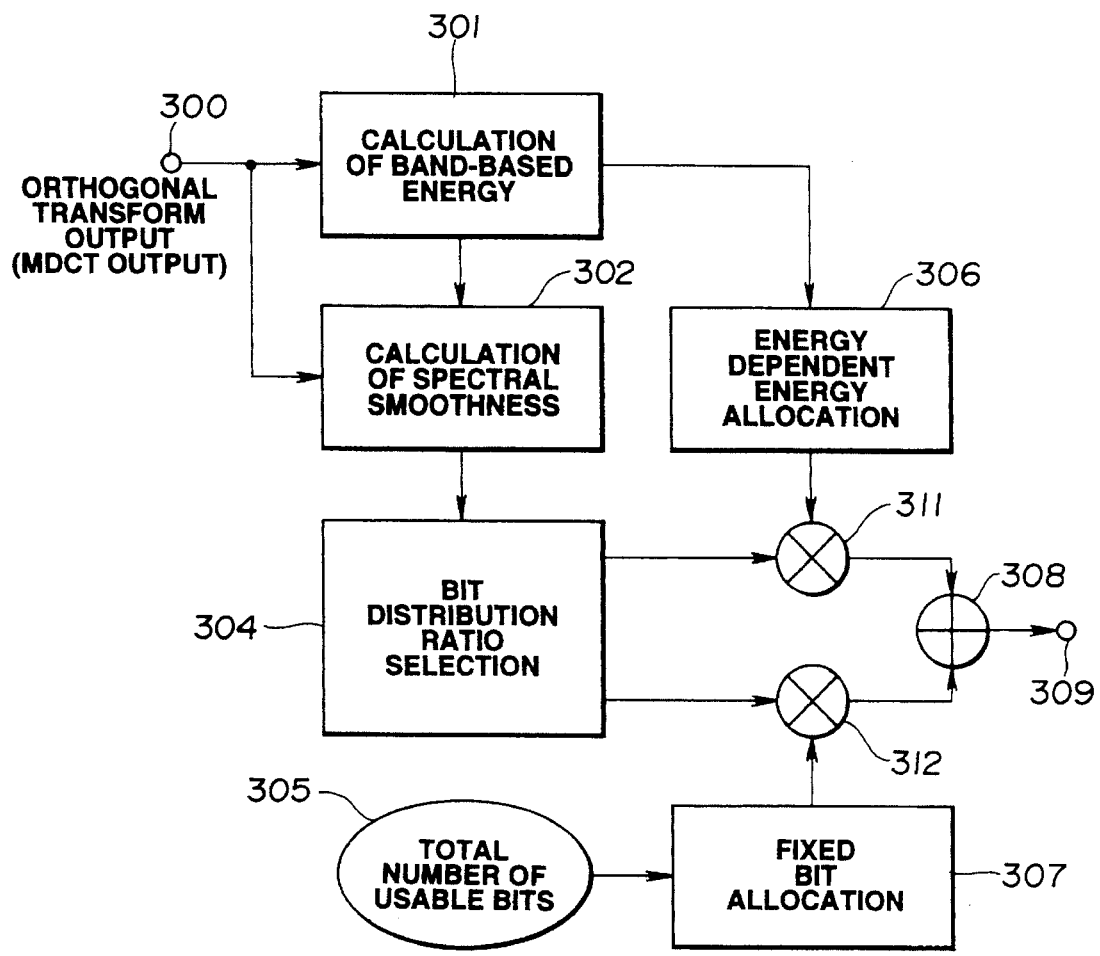
FIG. 10 is a block circuit diagram showing a concrete arrangement for implementing a second bit allocation method.

The bit allocation calculating circuit 107 is arranged as shown for example in FIG. 10. The following effective technique of bit allocation, which is different from the above-described technique of bit allocation, is explained by referring to FIG. 10.

Outputs of the MDCT circuits 103 to 105 in FIG. 4 are transmitted via an input terminal 300 of FIG. 10 to an energy calculating circuit 301 adapted for calculating the band-based energies. In the band-based energy calculating circuit 301, the signal energies for each of the critical bands and each of the sub-divided bands for higher frequencies are found by calculating root mean square values of the amplitudes in the respective bands. Meanwhile, the peak values or mean values of the amplitudes may be employed in place of the band-based energies.

The band-based spectral components of the sums of the respective critical bands or the bands sub-divided from the critical bands for the higher frequencies, as outputted from the energy calculating circuit 301, become the spectral components SB (Bark spectrum) shown in FIG. 7.

If, in the present embodiment, the number of bits indicating MDCT coefficients is employed for transmission or recording is 1 kbits/sec, a fixed bit allocation pattern is formed in the present embodiment using the 1 kbits. In the present embodiment, plural bit allocation patterns for the fixed bit allocation are provided and may be selectively employed depending on the signal properties. In the present embodiment, the fixed bit allocation circuit 307 has a variety of patterns in which the bits of short time blocks corresponding to 1 kbits are distributed for the respective frequencies. The fixed bit allocation circuit 307 has plural patterns having different bit allocation ratios for the mid to low frequencies and for the high frequencies. Such a pattern is selected which has the smaller number of bits allocated to the high frequencies for smaller signal magnitudes. In this manner, it becomes possible to take advantage of the loudness effect in which the sensitivity for the higher frequencies becomes lower for smaller signal magnitudes. Although the magnitude of the full-range signals may be employed as the signal magnitude, it is also possible to utilize an MDCT output or an output of the non-blocking frequency dividing circuit comprising, for example, a filter. The number of usable bits of 1 kbits, is set in, for example, a usable total bit number inputting circuit 305. The total number of bits may be entered from outside.

The output of the energy calculating circuit 301 is also transmitted to an energy dependent bit allocation circuit 306 which finds the energy-dependent bit allocation pattern from the band-based energies. The energy-dependent bit patterns are so set that the larger the energies of a given band, the greater the number of bits allocated to the band.

Referring to FIG. 10, the distribution ratio between the fixed bit allocation pattern and the bit allocation dependent upon the Bark spectrum (spectrum SB) is set by an index indicating the smoothness of the signal spectrum. That is, in the present embodiment, an output of the energy calculating circuit 301 is provided to a spectrum smoothness calculating circuit 302 in which the sum of absolute values of the differences between adjacent values of the signal spectral components divided by the sum of the signal spectral components is found and employed as the index of signal spectrum smoothness (tonality). Once this tonality is determined, the above-mentioned distribution ratio is found in the bit distribution ratio decision circuit 304. Meanwhile, the distribution ratio is used for changing the weighting ratio between the fixed bit allocation and the energy-dependent energy distribution.

The bit distribution ratio data from the bit distribution ratio decision circuit 304 is provided to a multiplier 312. The multiplier 312 is also provided with an output of the fixed bit distribution circuit 307, while being also supplied to a multiplier 311 supplied with an output of the energy dependent bit distribution circuit 306. Outputs of these multipliers 311, 312 are supplied to a summing circuit 308. That is, the number of bits determined by the fixed bit distribution and the number of bits by the spectrum-dependent bit distribution (based on energies of the critical bands and the bands sub-divided from the critical bands for the higher frequencies) are each multiplied by the values of the above-mentioned distribution ratio and the resulting products are summed by the summing circuit 308. The resulting sum data being supplied via an output terminal 309 (output terminal of band-based bit allocation) to downstream circuitry to be used for quantization.

Figure 11A:
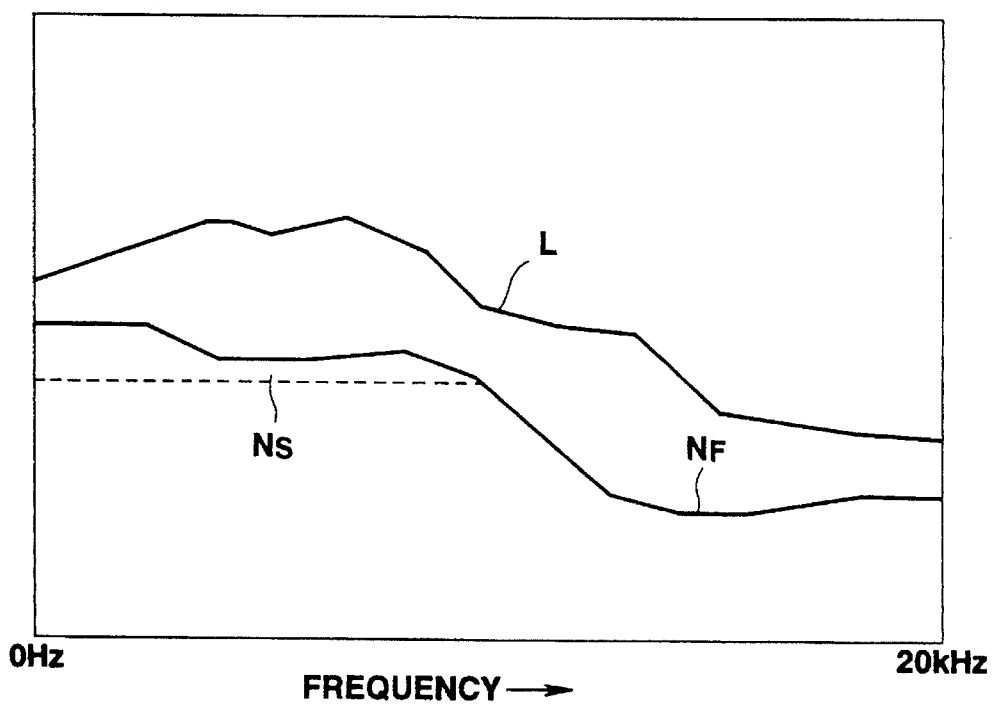
FIGS. 11a and 11b are graphs showing the bit allocation and the noise spectrum for a flatter signal spectrum with the second bit allocation method.
Figure 11B:
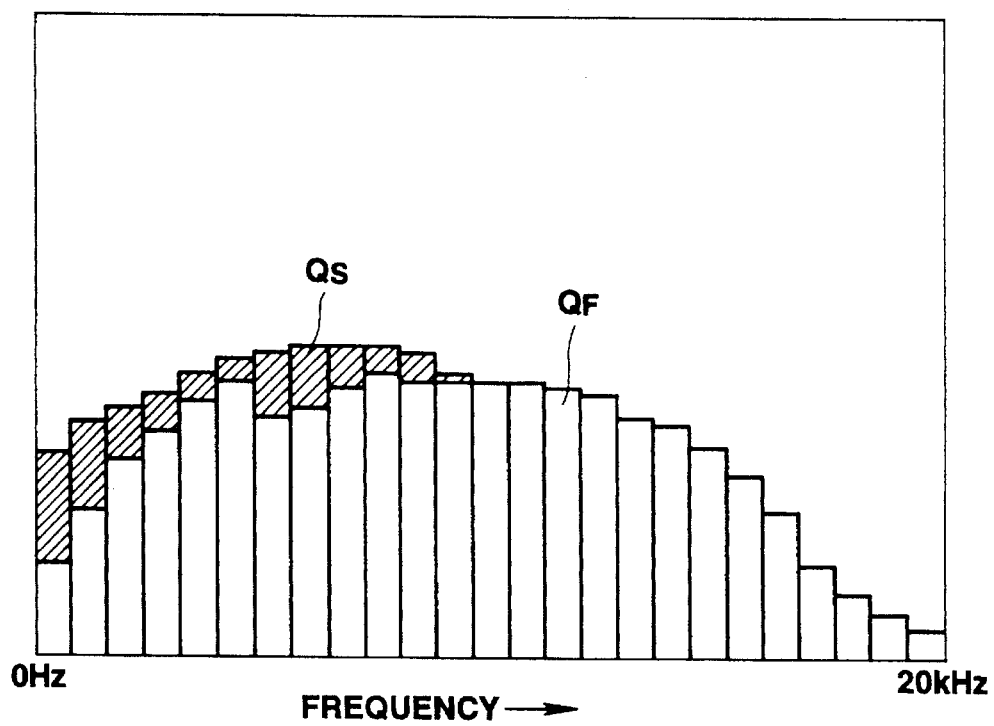
Figure 12A:
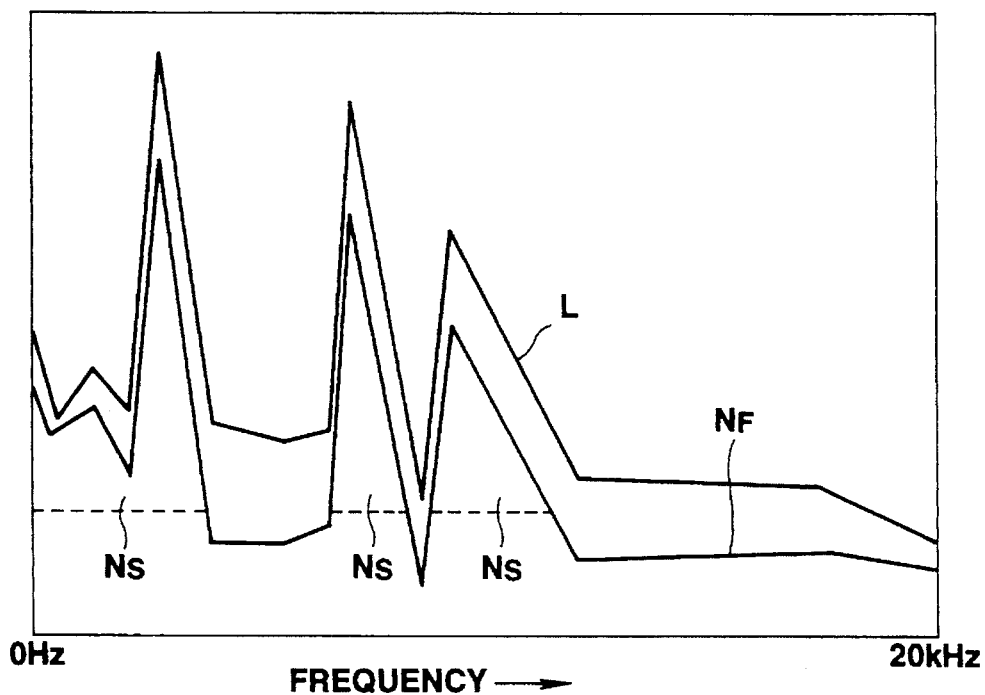
FIGS. 12a and 12b are graphs showing the bit allocation and the noise spectrum for the signal spectrum exhibiting high signal spectrum tonality with the second bit allocation method.
Figure 12B:
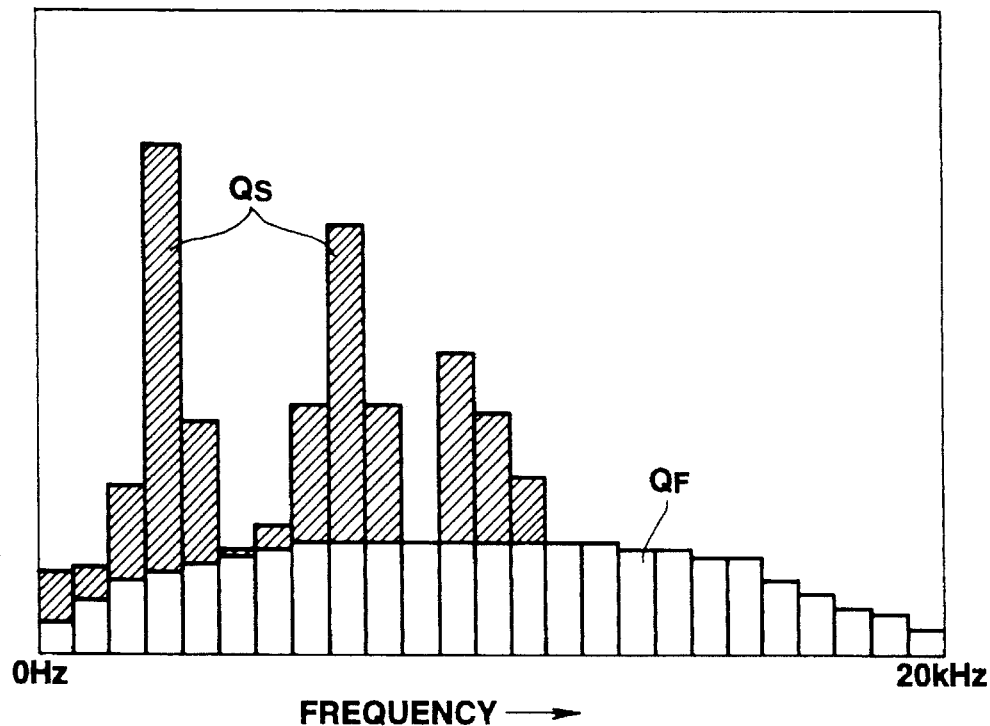

The manner of bit allocation at this point is shown in FIGS. 11b and 12b. The state of the associated quantization noise is shown in FIGS. 11a and 12a. FIGS. 11a and 11b illustrate a flatter signal spectrum, whereas FIGS. 12a and 12b illustrate the signal spectrum exhibiting high tonality. In FIGS. 11b and 12b, $Q_S$ indicates the signal level dependent bit quantity, and $Q_F$ indicates the bit quantity corresponding to fixed bit allocation. In FIGS. 11a and 12a, L indicates the signal level and $N_S$ and $N_F$ indicate the signal level dependent noise reduction and the noise level due to fixed bit allocation, respectively.

In FIG. 11b showing the flatter signal spectrum, bit allocation due to a larger quantity of the fixed bit allocation is useful in assuring a larger signal to noise ratio over the entire frequency range. However, in FIG. 11b, a smaller number of bits are allocated for the low and high frequency ranges because these ranges are less critical to the aural sense. By signal level dependent allocation of a smaller number of bits for the low and high frequencies, as shown at $Q_S$ in FIG. 11, the noise level of the bands having larger signal magnitudes is selectively reduced. Consequently, the frequency range selectivity becomes broader for a flatter signal spectrum.

Conversely, if the signal spectrum indicates high tonality, as shown in FIG. 12b, a large number of bits by the signal level dependent bit allocation is employed to reduce the quantization noise of an extremely narrow band indicated by $N_S$ in FIG. 12a. This improves characteristics of lone spectral input signals. Also, the noise level-may be non-selectively reduced over a wide frequency range by the smaller number of bits by the fixed bit allocation.

Returning to FIG. 4, the adaptive bit allocation and encoding circuit 108 is explained. In the present embodiment, there are two bit rate modes A and B, for example, with the bit rate mode A being 128 kbps/channel and the bit rate mode B being one-half the bit rate for the mode A, or 64 kbps/channel. However, there may also be more than two bit rate modes.

Figure 13:
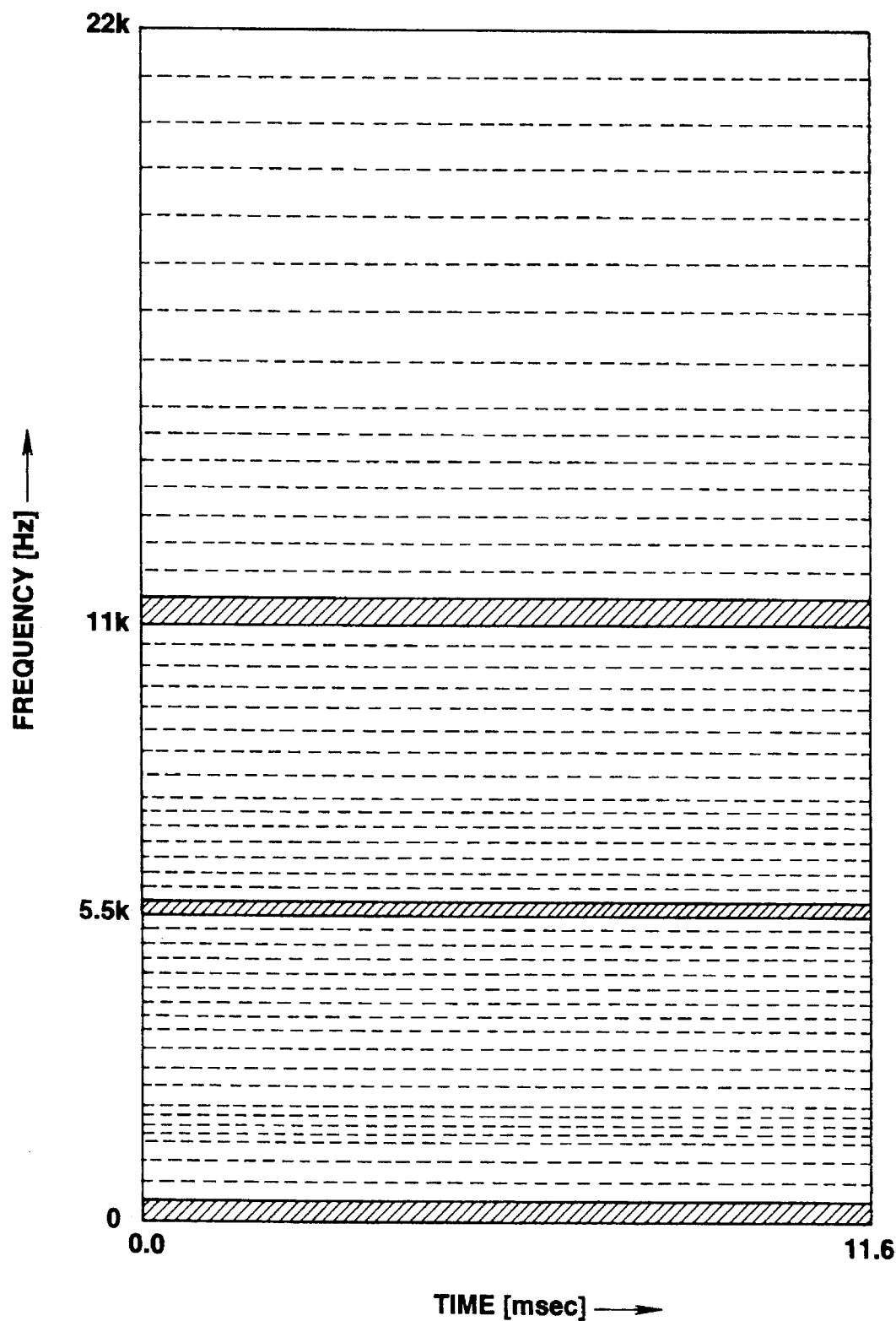
FIG. 13 is a graph showing the relation between the frequency and the time for a processing block of 11.6 msec for an A mode, with the frequency range being divided into 52 bands including critical bands and bands for taking the block floating into account, with the block size for the orthogonal transform being of a long mode.
Figure 14:
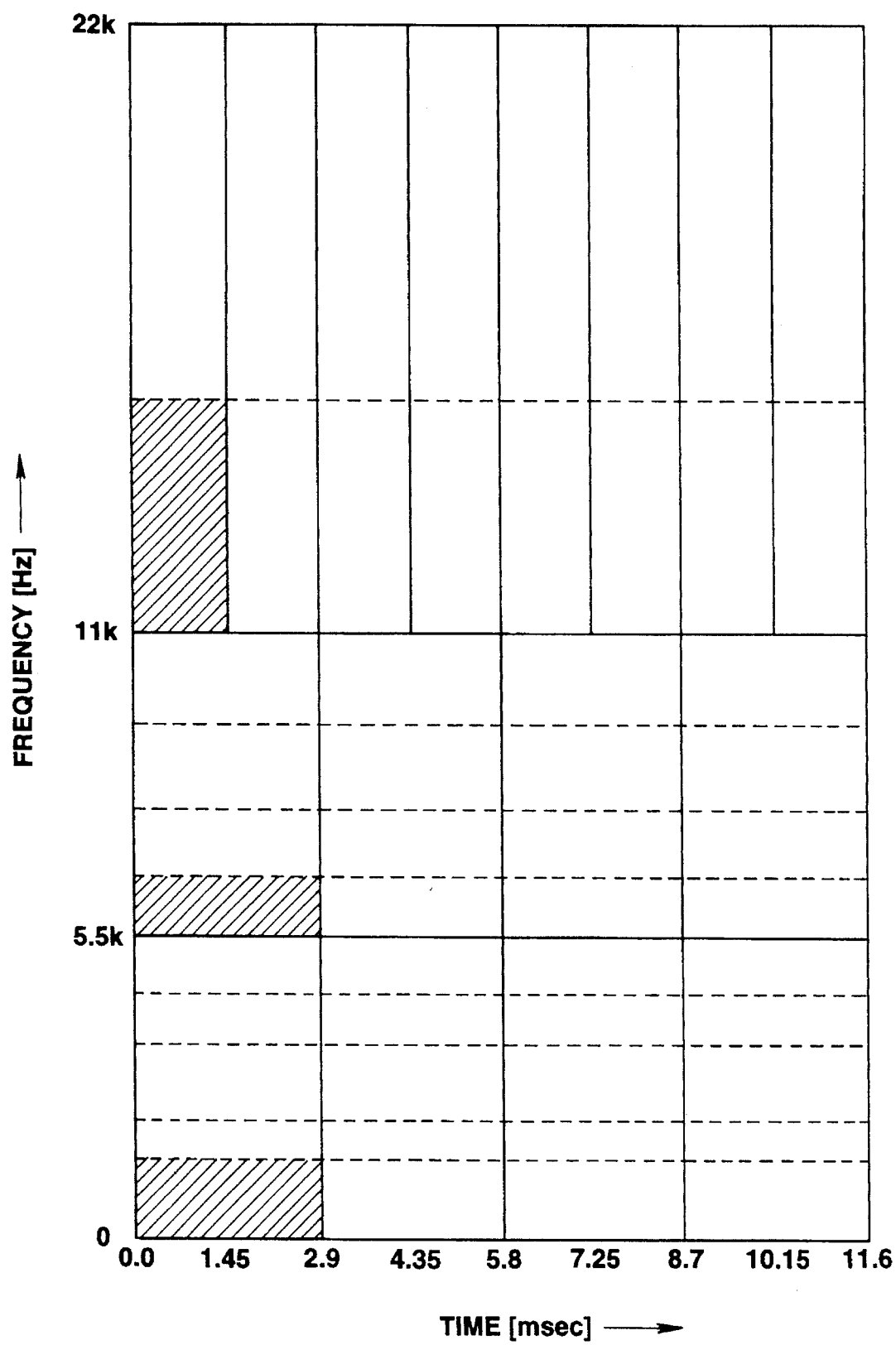
FIG. 14 is a graph showing the relation between the frequency and the time for a processing block of 11.8 msec for the A mode, with the frequency range being divided into 52 bands including critical bands and bands for taking the block floating into account, with the block size for the orthogonal transform being of a short mode.

First, the encoding method for the mode A (A-mode) is explained. FIGS. 13 and 14 show a typical example of the block floating band division for the A-mode. In FIG. 13, in which the orthogonal transform block size is 11.6 ms, and in FIG. 14, in which the frequency range is divided into four and eight for the low to mid frequency range and for the high frequency range, respectively, the total number of the block floating bands is the same and equal to 52. As for the numbers of the block floating bands, as outputs of the frequency dividing filters 101 and 102, there are 20 block floating bands for the low frequency range and 16 block floating bands for the mid to high frequency range. Since these numbers remain fixed without regard to the orthogonal transform block size, there is no convenience even although the orthogonal transform block size is independently changed from band to band. For example, assuming that the block size is 1.6 ms divided by four only for the low frequency range, with the block size being 11.6 ms for the mid to high frequency range, the total number of the block floating bands becomes equal to 52 if the low frequency range and the mid to high frequency range are divided as shown in FIGS. 14 and 13, respectively. In the adaptive bit allocation encoding circuit 108, there are accorded the information data for the scale factor and the word length for each of the 52 block floating bands, with the spectral data being quantized and encoded depending on the accorded scale factors and word lengths.

The encoded data is outputted at the output terminal 110 for recording or transmission.

Figure 15:
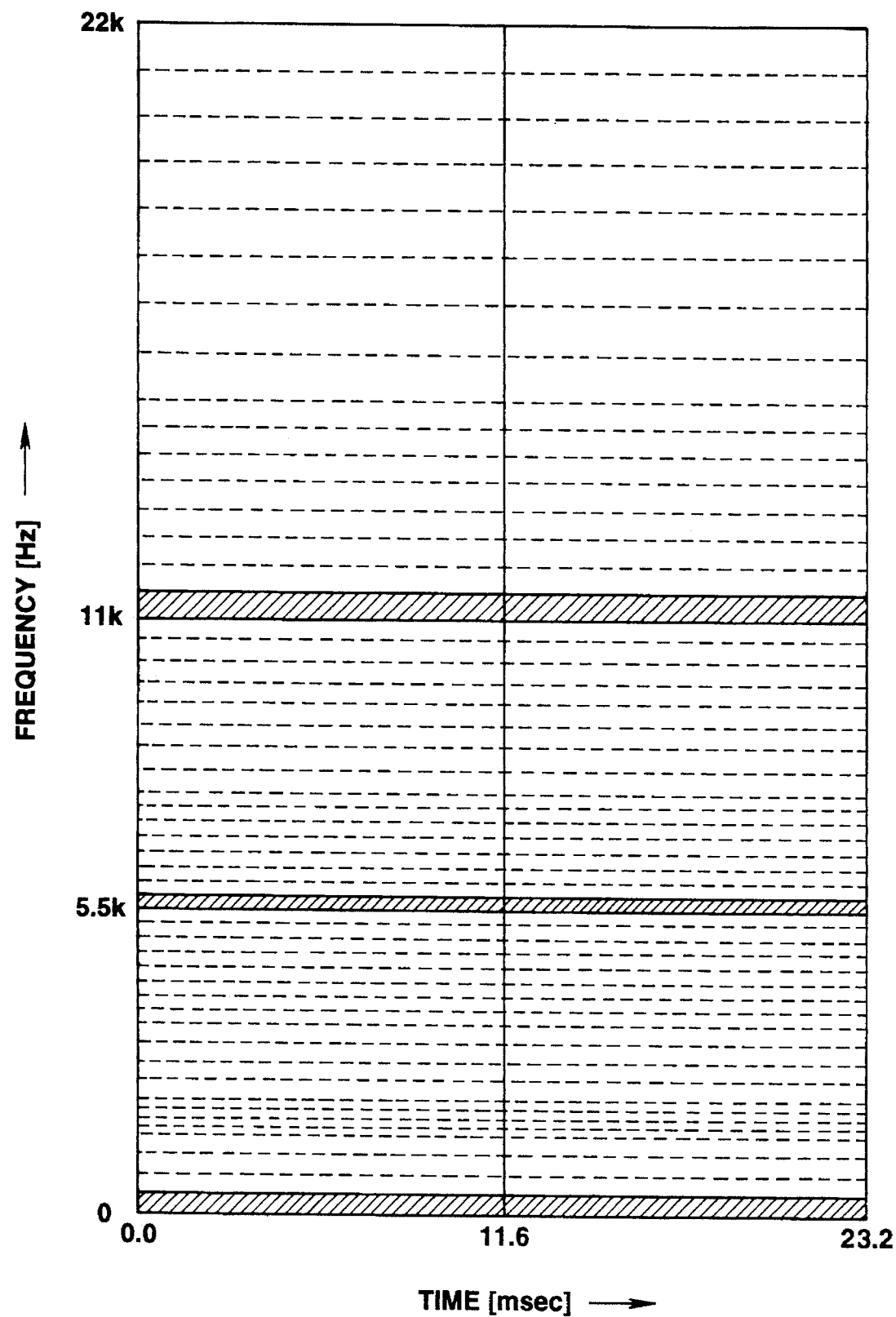
FIG. 15 is a graph showing the relation between the frequency and the time for a processing block of 23.2 msec for the B mode, with the frequency range being divided into 52 bands including critical bands and bands for taking the block floating into account, with the block size for the orthogonal transform being of a long mode.
Figure 16:
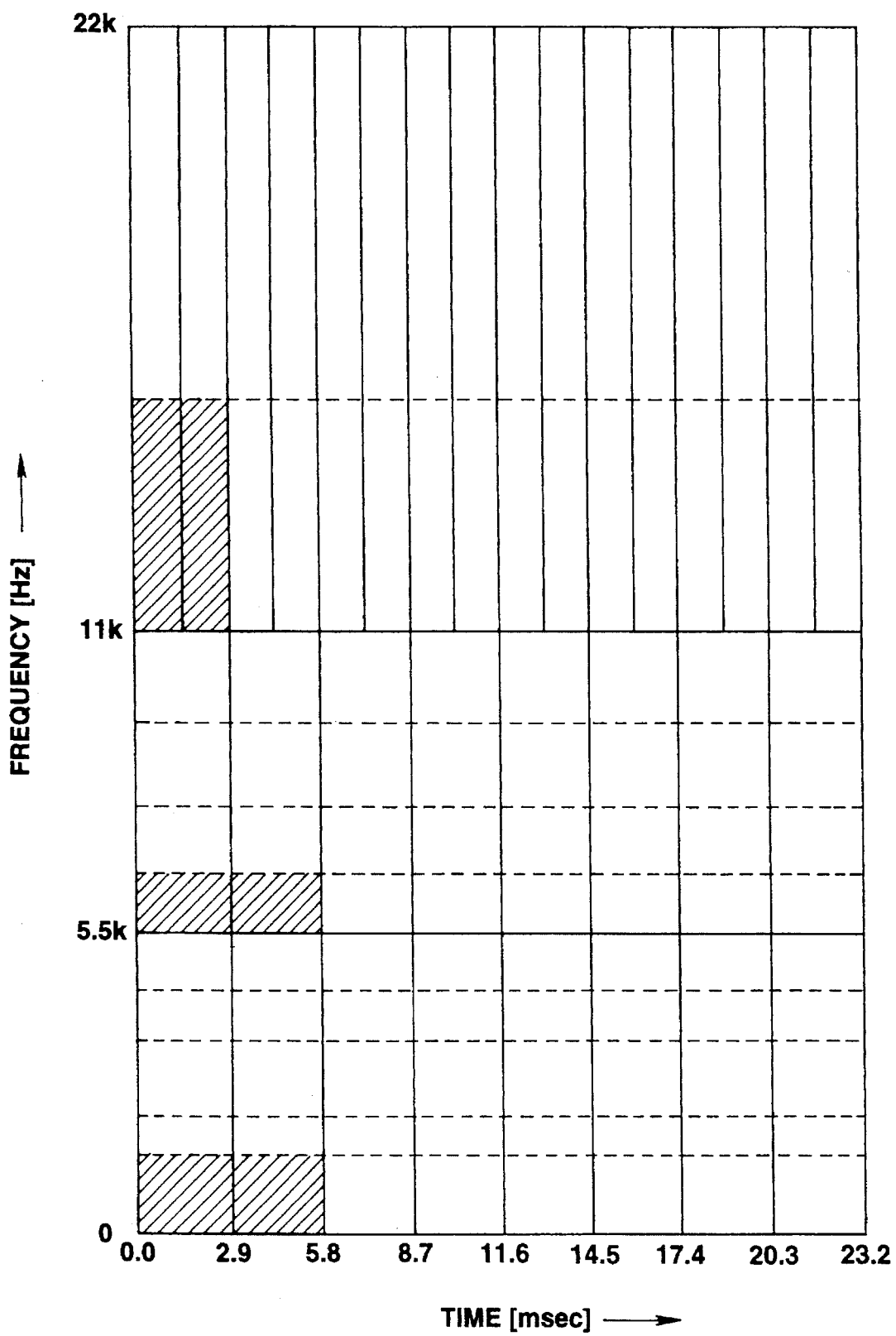
FIG. 16 is a graph showing the relation between the frequency and the time for a processing block of 23.2 msec for the B mode, with the frequency range being divided into 11 bands for a processing block of 23.2 msec for the B mode including critical bands and bands for taking the block floating into account, with the block size for the orthogonal transform being of a short mode.
Figure 17:
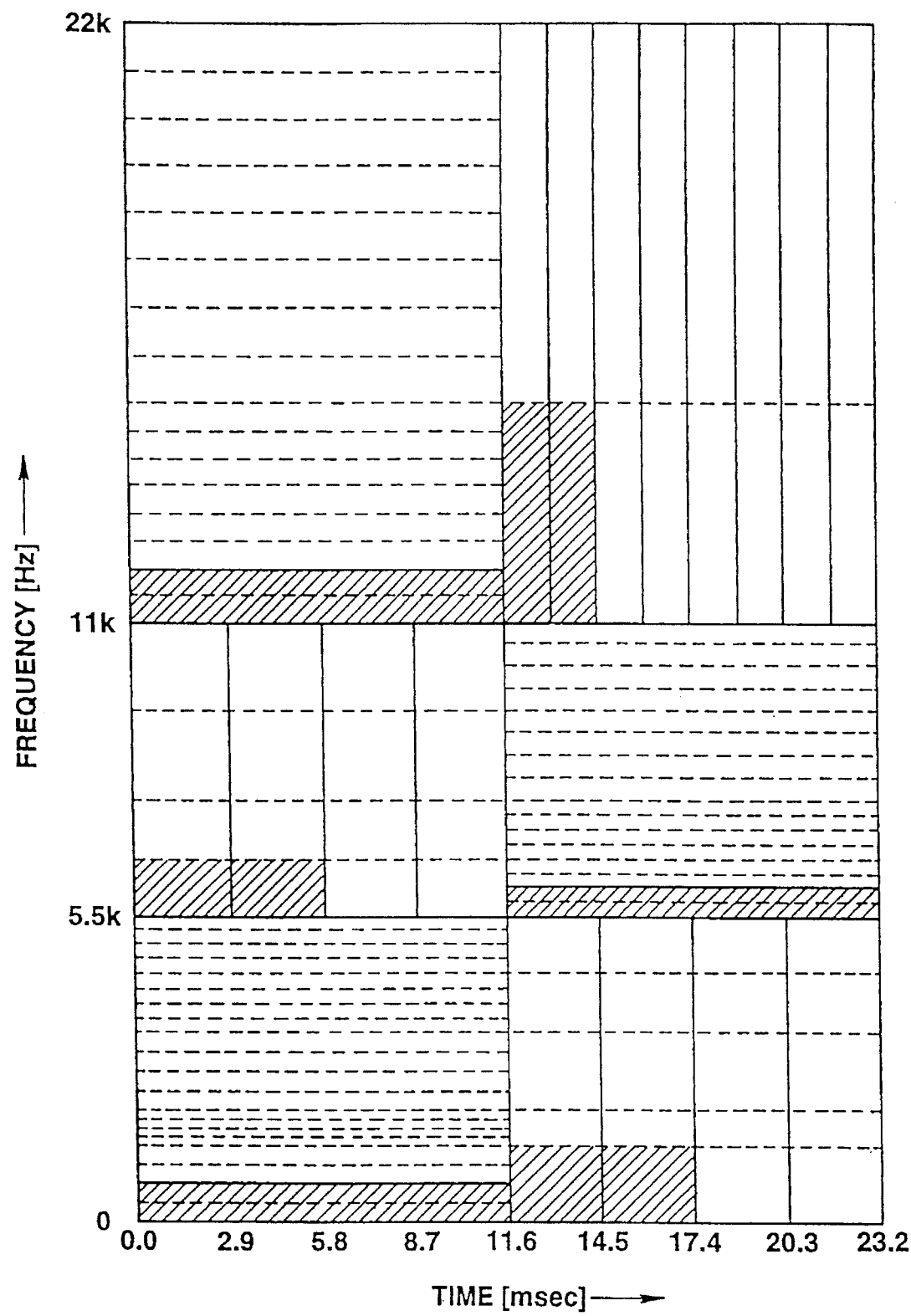
FIG. 17 is a graph showing the relation between frequency and time for a processing block of 23.2 msec for the B mode including critical bands and bands for taking block floating into account, with the block size for the orthogonal transform being of both a short mode and a long mode.

Next, the encoding method for the B-mode is explained. Since the bit rate for the B-mode becomes one-half that of the A-mode, the volume of the subsidiary information, such as the scale factor, word length or the like, is not changed, and only the volume of the main information, that is spectral data, is diminished, if the encoding method remains the same as that used for the B-mode. That is, with the B-mode, the proportion of the subsidiary information in the total information volume is increased and hence the encoding efficiency is lowered as compared to the A-mode. If the bit rate is halved, it is desirable that not only the volume of the main information but also the volume of the subsidiary information be diminished to one half or less. In the present embodiment, reduction of the volume of the subsidiary information is achieved by having the value of the subsidiary information between two temporally adjacent blocks. That is, for halving the volume of the subsidiary information for the B-mode as compared to that for the A-mode. Since the volume of the subsidiary information for the A-mode is basically the same as that of the number of the block frequency bands, it is equal to 52/11.6 ms. For the B-mode, since the block floating band is extended along the time scale is extended, the volume of the subsidiary information is equal to 52/23.2 ms. Thus the volume of the subsidiary information within the same time interval for the B-mode is half that for the A-mode. FIGS. 15 to 17 illustrate a an example of block floating band division for the B-mode.

In the graph of FIG. 15, the orthogonal transform block sizes of two temporally neighboring blocks are of the long mode. The areas delimited by solid lines each indicate an orthogonal transform block, while hatched areas each indicate a single block floating band or an area represented by one and the same subsidiary information.

That is, the block floating bands shown in FIG. 15 are formed by unifying two block floating bands neighboring along the time scale for the A-mode as shown in FIG. 13. Stated differently, the subsidiary information as set for two temporally neighboring block floating bands for the A-mode in FIG. 13 is used in common so that the same subsidiary information is set for these two block floating bands.

If viewed along the frequency scale, the relation between the block floating bands and the subsidiary information is the same as that shown in FIG. 13.

In the graph of FIG. 16, both the orthogonal transform block sizes of two temporally neighboring blocks are of the short modes. The areas delimited by solid lines each indicate an orthogonal transform block, while hatched areas each indicate a single block floating band. That is, the block floating bands shown in FIG. 16 are formed by unifying two block floating bands neighboring along the time scale for the A-mode as shown in FIG. 14. The manner of frequency division into bands along the frequency scale is the same as that shown in FIG. 14.

In the graph of FIG. 17, the orthogonal transform block size differs between two temporally neighboring blocks, that is, the orthogonal transform block sizes of these blocks consist in the combination of the short and long modes. The areas delimited by solid lines each indicate an orthogonal transform block, while hatched areas each indicate a single block floating band. The blocks having the orthogonal transform block size of the short mode, that is the blocks for the mid range of 0 to 11.6 ms and the low and high ranges of 11.6 to 23.2 ms in FIG. 17, are the same as those of the short mode shown in FIG. 16.

In further detail, the two bands temporally neighboring along the time scale of the block floating band of the A-mode shown in FIG. 14 are grouped together. In other words, the subsidiary information as set in the two temporally neighboring block floating bands is used in common, so that the same subsidiary information is set for the two block floating bands.

If viewed along the frequency scale, the manner of frequency division into bands and the relation between the block floating bands and the subsidiary information remain the same as those shown in FIG. 14.

As for the blocks having the orthogonal transform block size of the long mode, that is the blocks for the low and high ranges of 0 to 11.6 ms and the mid range of 11.6 to 23.2 ms as shown in FIG. 17, since the block floating bands in these blocks are not divided along the time scale, it being impossible to unify the bands along the time scale or to use the common subsidiary data between two neighboring block floating bands, the two bands neighboring each other along the frequency scale are unified into one band as exceptional measures. Alternatively, the subsidiary information as set for two block floating bands neighboring each other along the frequency scale is used in common so that the same subsidiary information is set for these two block floating bands. If viewed along the time scale, the relation between the block floating bands and the subsidiary information is the same as that shown in FIG. 13.

Thus, for halving the number of the subsidiary dam for the B-mode as compared to that for the A-mode, the two block floating bands neighboring each other along the time scale or the frequency scale are used in common, or the subsidiary information as set for the two block floating bands neighboring each other along the time scale or the frequency scale is used in common. This allows the same subsidiary information to be used for these two block floating bands. As a result, the main information may be prevented from being decreased significantly with reduction in the bit rate, while the encoding efficiency may be improved.

Figure 18:
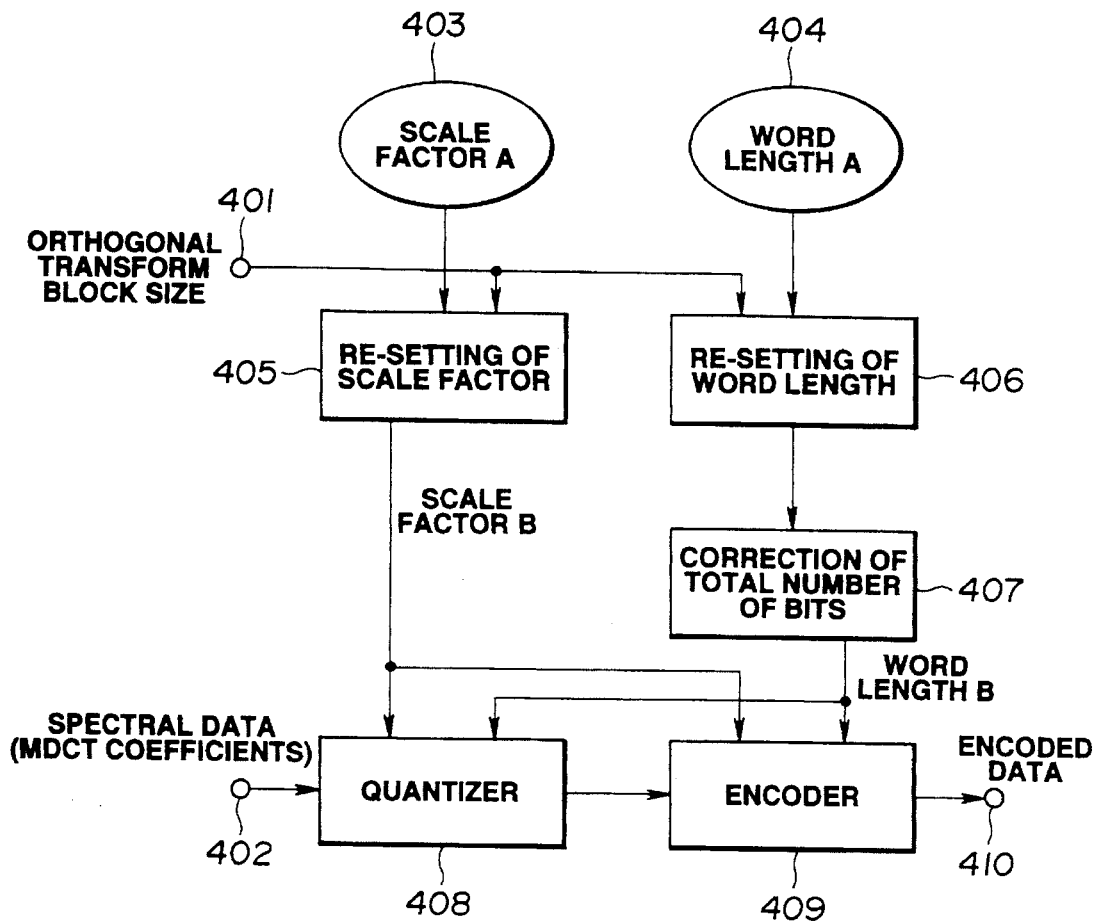
FIG. 18 is a block diagram showing an embodiment of an adaptive bit allocation and encoding circuit for the B-mode.

FIG. 18 shows an example of an adaptive bit allocation and encoding circuit 108 for the B-mode, in which the information of the orthogonal transform block size and spectral data for the above-mentioned spectral data (MDCT coefficients) are supplied to terminals 401 and 402, respectively. The information concerning the orthogonal transform block size is sent to a scale factor re-setting circuit 405 and a word length re-setting circuit 406, while the spectral data (MDCT coefficients) are sent to a quantizer 408.

The scale factors A for the temporally neighboring two block floating bands, as set for the respective bands at the time of block floating band division for the A-mode and supplied via an input circuit 403, are grouped together by the scale factor re-setting circuit 405, so that the scale factor B for the B-mode is re-set. Usually, the larger one of the two scale factors A is selected and used as a common scale factor.

Similarly, the word length B for the B-mode is m-set by the word length re-setting circuit 406 from the word lengths A which is set for the respective bands at the time of division into block floating bands and which is supplied via an input circuit 404. In re-setting the word length, the larger one of the two word lengths A, for example, is selected. Alternatively, a mean value of the two word lengths A may be employed.

Meanwhile, two blocks (23.2 ms) each of the scale factor A and the word length A are each sent as one unit to the re-setting circuits 405 and 406, respectively.

The re-set word length data is then corrected by the word length re-setting circuit 406 for errors produced by the re-setting operation in connection with the total numbers of bits. The scale factor B and the word length B as re-set am sent to a quantizer 408 and an encoder 409 so as to be employed during quantization of the spectral data. The quantized and encoded spectral data are outputted as encoded data B at a terminal 410.

In the foregoing, description has been made of the function of the encoding apparatus used for encoding the chronological PCM signals. Referring to the embodiment shown in FIG. 19, explanation is now given of the conversion from the A-mode encoded data into the B-mode encoded data and the of conversion from the B-mode encoded data into the A-mode encoded data.

First, as for the conversion from the A-mode to the B-mode, the encoded data A encoded with the A-mode is supplied to an input terminal 501, while the encoded orthogonal transform block size information is supplied to an input terminal 503. The orthogonal transform block size information is code-converted in a code converter 508 from the code indicating the orthogonal transform block size for the A-mode into the code indicating that for the B-mode. The code-converted information is transmitted to a bit allocation calculating circuit 507, while also being outputted at an output terminal 513.

The function of the code converter 508 is simply to group together the orthogonal transform block size information for two blocks for the A-mode and to encode the resulting information by the coding for the B-mode without causing any changes in the contents of the information.

The encoded data A is sent to an adaptive bit allocation and encoding circuit 505 where it is restored into spectral data by decoding and inverse quantization. The resulting spectral data is transmitted to a bit allocation and calculating circuit 507 for bit allocation. The bit allocation and calculating circuit 507 has the same function as that of the above-mentioned bit allocation calculating circuit 107.

The restored spectral data is sent to an adaptive bit allocation and encoding circuit 506 for the B-mode for encoding according to the B-mode as mentioned above. The quantized and encoded data B is outputted at an output terminal 511. Thus the conversion from the A-mode into the B-mode is executed by a simplified circuit consisting of the combination of the decoding circuit for the A-mode and the encoding circuit for the B-mode to enable high-speed conversion.

For conversion from the B-mode to the A-mode, the encoded data B (encoded with the B-mode) is supplied to an input terminal 512, while the encoded orthogonal transform block size information is supplied to an input terminal 514. The orthogonal transform block size information is code-converted by a code converter 509 from the code indicating the orthogonal transform block size for the B-mode into the code indicating the orthogonal transform block size for the A-mode. The code-converted block size information is transmitted to a format converting circuit 510, while being outputted at an output terminal 504.

The function of the code converter 509 is the reverse of that of the code converter 508 and consists simply in dividing the coded orthogonal transform block size information for the B-mode into coded data for two blocks for the A-mode.

The encoded data B is sent to the format converting circuit 510 whereby the encoded data is directly converted into data of the format of the A-mode before being outputted at an output terminal 502. There is no substantial change in the bit rate between the two modes such that only about one half of the main information is employed on the A-mode format. It is also possible to effect decoding and re-allocation of bits followed by encoding as in the above-mentioned conversion from the A-mode to the B-mode. However, the sound quality is deteriorated by re-quantization even although the substantial information volume is increased. Since the conversion from the B-mode into the A-mode may be achieved by format conversion, that is by simple re-arraying of coded data, the speed of conversion may further be raised.

Figure 20:
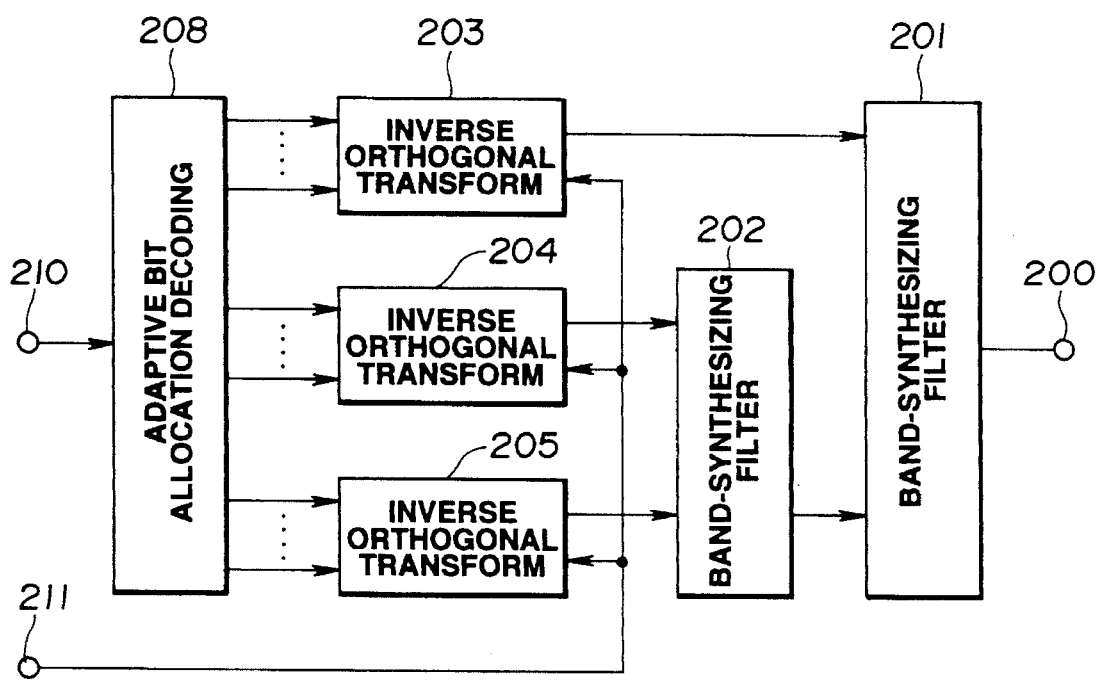
FIG. 20 is a block circuit diagram showing a specific example of a decoding apparatus for implementing the high efficiency encoding technique for audio data according to the present invention.

Referring to FIG. 20, the decoding apparatus is explained. The encoded data in the frequency domain is supplied from the output terminal 110 of FIG. 4 to an input terminal 210. The encoded data is first supplied to a decoding circuit 208 for adaptive bit allocation and thereby decoded into spectral data in the frequency domain.

Figure 19:
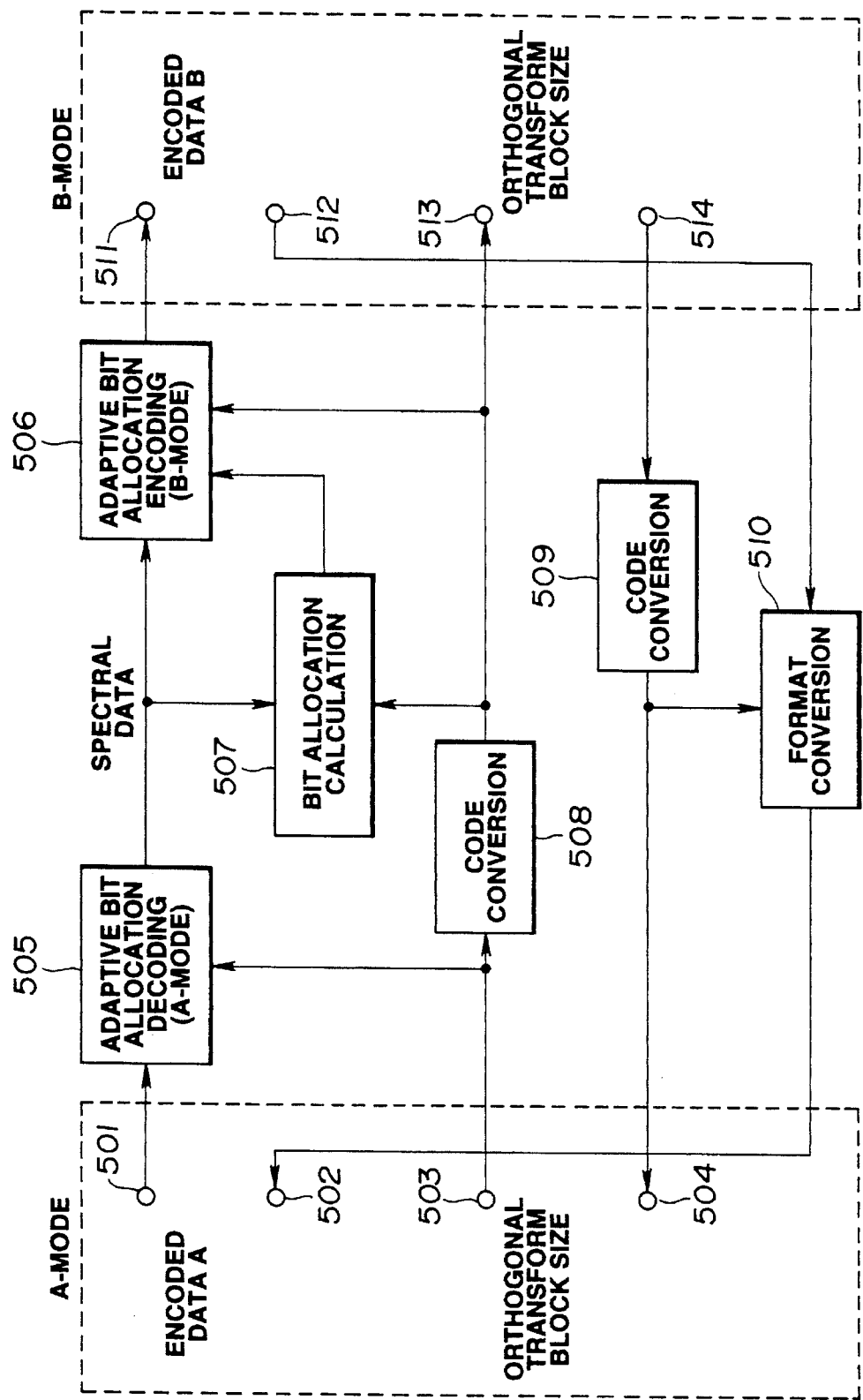
FIG. 19 is a block circuit diagram showing a specific arrangement for high speed conversion from the A mode to the B mode.

The orthogonal transform block size information from the encoding apparatus of FIG. 19 is supplied to an input terminal 211 and thence supplied to inverse orthogonal transform circuits 203, 204 and 205 for the respective bands. Of the above spectral data, the data for the band from 0 to 5.5 kHz is supplied to the inverse transform circuit 203 and the data for the band from 5.5 to 11 kHz is supplied to the inverse transform circuit 204, while the data for the band of from 11 to 22 kHz is supplied to the inverse transform circuit 205. By these circuits 203 to 205, the spectral data is inverse orthogonal transformed, depending on the above-mentioned orthogonal block size information.

The outputs of the inverse orthogonal transform circuits 204 and 205 are synthesized by a band-synthesizing filter 202, while the outputs of the inverse orthogonal transform circuit 203 and the synthesizing filter 202 are synthesized by a band-synthesizing filter 201 so as to be outputted at an output terminal 200 as replay signals.

The present invention is not limited to the above-described embodiments. For example, the two recording/replay media may be interconnected by a data transfer cable without it being necessary to have the two media built into one system. The present invention may be applied not only to audio PCM signals but also to digital speech signals or digital video signals. The synthesis of the above-mentioned minimum audibility curve may also be omitted, in which case the minimum audibility curve generating circuit 32 or the synthesizing circuit 27 may be omitted and an output of the subtractor 24 may be directly transmitted to the subtractor 28 after deconvolution by the divider 26. In addition, a wide variety of bit allocation techniques may be employed, such as fixed bit allocation, bit allocation based on signal band energies or bit allocation consisting of the combination of fixed bit allocation and variable bit allocation.

It is seen from above that the present invention provides an apparatus and method for recording compressed data onto a recording medium therefor, whereby it becomes possible to prevent the sampling frequency signal generating circuit and hence the hardware from being increased in scale by employing the same sampling frequency despite the difference in the bit rate appropriate for different modes.

When encoding with the low bit rate, by using the same subsidiary information for plural block floating bands neighboring each other in the time domain or plural block floating bands neighboring each other along the frequency domain in one and the same time block for recording or transmission, and by changing the combination of the block floating bands for which the subsidiary information is to be used in common, such changes depending upon the orthogonal transform block size, it becomes possible to reduce the volume of the subsidiary information while minimizing the effect on the quantization and encoding efficiency. The subsidiary information thus saved may be allocated to the main information to improve the quantization and encoding efficiency.

If it is desired to convert high bit rate mode compressed signals into low bit rate mode signals for long time recording, the low bit rate compressed signals may be produced solely by data conversion in the frequency domain without the necessity of converting the original frequency-domain compressed signals into corresponding time-domain signals. High-speed signal transformation may be achieved because the process of orthogonal transform, inverse orthogonal transform and band-dividing and synthesizing filtering may be eliminated.

What is claimed is:

1. An apparatus for recording, reproducing, transmitting and/or receiving compressed data in which digital signals are separated into signal components of plural frequency bands to produce signal components in plural two-dimensional blocks along time and frequency, the signal components being quantized and compressed for each of the two-dimensional blocks along time and frequency so as to be recorded or transmitted along with information compressing parameters for each of the two-dimensional blocks along time and frequency, and/or in which the information-compressed signal components within each of the two-dimensional blocks along time and frequency are reproduced or received using the information compressing parameters for each of the two-dimensional blocks along time and frequency, wherein the improvement comprises:

means for grouping for use in common the information compressing parameters for at least two of said two-dimensional blocks, prior to at least one of recording, transmitting, reproducing and receiving.

2. The apparatus as claimed in claim 1, wherein the information compressing parameters of at least two two-dimensional blocks are arrayed in the time domain.

3. The apparatus as claimed in claim 2, wherein the information compressing parameters of at least two two-dimensional blocks are arrayed in and neighboring each other in the time domain.

4. The apparatus as claimed in claim 1, wherein the information compressing parameters of at least two two-dimensional blocks are arrayed in the frequency domain.

5. The apparatus as claimed in claim 4, wherein the information compressing parameters of at least two two-dimensional blocks are arrayed in and neighboring each other in the frequency domain.

6. The apparatus as claimed in claims 2 or 4, wherein the information compressing parameters of at least two two-dimensional blocks are arrayed in at least one of the frequency domain and the time domain.

7. The apparatus as claimed in claim 1, wherein the information compressing parameters of at least two two-dimensional blocks are arrayed in and neighboring each other on at least one of the frequency domain and the time domain.

8. An apparatus having modes for recording, reproducing, transmitting and/or receiving compressed data in which digital signals are separated into signal components of plural frequency bands to produce signal components in plural two-dimensional blocks along time and frequency, the signal components being quantized and compressed for each of the two-dimensional blocks along time and frequency so as to be recorded or transmitted along with information compressing parameters for each of the two-dimensional blocks along time and frequency, and/or in which the information-compressed signal components within each of the two-dimensional blocks along time and frequency are reproduced or received using the information compressing parameters for each of the two-dimensional blocks along time and frequency, wherein the improvement comprises:

means for changing the number of plural information bit rates, with the number of the information compressing parameters being changed based upon an information bit rate for a selected mode.

9. The apparatus as claimed in claim 8, further comprising:

means for increasing the number of information-compressing parameters in response to a higher information bit rate for a selected mode.

10. The apparatus as claimed in claim 8, further comprising:

means for decreasing the number of information-compressing parameters in response to a lower information bit rate for a selected mode.

11. The apparatus as claimed in claim 8, further comprising:

means for changing the number of the information-compressing parameters in proportion to the information bit rates for the selected modes.

12. The apparatus as claimed in claim 11, wherein the information-compressing parameters of at least two two-dimensional blocks are arrayed in at least one of the time scale and the frequency scale to achieve a reduction in the number of the information-compressing parameters.

13. The apparatus as claimed in claim 11, wherein the information-compressing parameters of at least two neighboring two-dimensional blocks are arrayed in at least one of the time scale and the frequency scale to achieve a reduction in the number of the information-compressing parameters.

14. The apparatus as claimed in claim 11, wherein the information compressing parameters become larger in number for those modes having a lower information bit rate.

15. The apparatus as claimed in claim 14, wherein the information compressing parameters increase in inverse proportion to the information bit rate for each mode.

16. The apparatus as claimed in claim 15, further comprising:

means for producing at least one two-dimensional block which is at least one of a block-floating block and a quantization noise generation suppressing block.

17. The apparatus as claimed in claims 7 or 16 wherein input signals are audio signals, further comprising:

means for setting the frequency width of at least a majority of the quantization noise suppressing blocks to be broader towards higher frequencies.

18. The apparatus as claimed in claims 7 or 16, further comprising:

means for dividing the digital signals into plural frequency components, the plural frequency components divided into plural bands to produce signal components in the two-dimensional blocks along time and frequency, and for orthogonally transforming for each band each block to produce coefficient data; and means for converting signals in the plural bands in the frequency domain into signals in the time domain by inverse orthogonally transforming, for each of the plural bands in the frequency domain, the signals in each the plural bands; and means for synthesizing such inverse orthogonally transformed signals to produce synthesized signals in the time domain.

19. The apparatus as claimed in claim 18, further comprising:

means for selecting to be the same for two consecutive bands in the lowest frequency range at least one of the frequency width on division from time-domain signals prior to orthogonal transform into plural bands in the frequency domain and the frequency width on synthesis from plural bands in the frequency domain subsequent to inverse orthogonal transform into signals in the time domain.

20. The apparatus as claimed in claims 7 or 16, further comprising:

orthogonal transform means for dividing the digital signals into plural frequency components to produce signal components in plural two-dimensional blocks along time and frequency; and inverse orthogonal transform means for converting signals in the two-dimensional blocks along time and frequency into digital signals in the time domain.

21. The apparatus as claimed in claim 20, further comprising:

means for varying the block size of at least one of the orthogonal transform or the inverse orthogonal transform.

22. The apparatus as claimed in claim 21, further comprising:

means for selecting to be broader towards higher frequencies frequency width of divisions for at least one of time-domain signals prior to orthogonal transform into plural bands in the frequency domain and synthesized time domain signals subsequent to inverse orthogonal transform into signals in the time domain.

23. The apparatus as claimed in claim 22, wherein the means for selecting selects orthogonal transform block size to be the same among all of the modes having different information bit rates.

24. The apparatus as claimed in claim 23, further comprising:

means for converting compressed data between modes having different information bit rates, such conversion of effected on the signal components in the frequency domain.

25. The apparatus as claimed in claim 24, wherein the means for converting compressed data between-modes, when mode-converting compressed data from a mode having a higher information bit rate to a mode having a lower information bit rate, converts the compressed data in the frequency domain.

26. The apparatus as claimed in claim 25, wherein the means for converting compressed data, when mode-converting compressed data from a mode having a lower information bit rate to a mode having a higher information bit rate, converts the compressed data on encoded compressed data.

27. A method for recording, reproducing, transmitting and/or receiving compressed data in which digital signals are divided into signal components of plural frequency bands to produce signal components in plural two-dimensional blocks along time and frequency, the signal components being quantized and compressed for each of the two-dimensional blocks along time and frequency so as to be recorded or transmitted along with information compressing parameters for each of the two-dimensional blocks along time and frequency, and/or in which the information-compressed signal components within each of the two-dimensional blocks along time and frequency are reproduced or received using the information compressing parameters for each of the two-dimensional blocks along time and frequency, wherein the improvement comprises the step of:

grouping for use in common the information compressing parameters for at least two of said two-dimensional blocks for at least one of recording, transmitting, reproducing and receiving.

28. The method as claimed in claim 27, wherein the information compressing parameters of at least two two-dimensional blocks are arrayed in the time domain.

29. The method as claimed in claim 28, wherein the information compressing parameters of at least two two-dimensional blocks are arrayed in and neighboring each other in the time domain.

30. The method as claimed in claim 27, wherein the information compressing parameters of at least two two-dimensional blocks are arrayed in and neighboring each other in at least one of the frequency domain and the time domain.

31. The method as claimed in claim 27, wherein the information compressing parameters of at least two two-dimensional blocks are arrayed in the frequency domain.

32. The method as claimed in claims 28 or 31, wherein the information compressing parameters of at least two two-dimensional blocks are arrayed in at least one of the frequency domain and the time domain.

33. The method as claimed in claim 31, wherein the information compressing parameters of at least two two-dimensional blocks are arrayed in and neighboring each other in the frequency domain.

34. A method for recording, reproducing, transmitting and/or receiving compressed data in which digital signals are divided into signal components of plural frequency bands to produce signal components in plural two-dimensional blocks along time and frequency, the signal components being quantized and compressed for each of the two-dimensional blocks along time and frequency so as to be recorded or transmitted along with information compressing parameters for each of the two-dimensional blocks along time and frequency, and/or in which the information-compressed signal components within each of the two-dimensional blocks along time and frequency are reproduced or received using the information compressing parameters for each of the two-dimensional blocks along time and frequency, wherein the improvement comprises the step of:

changing the number of the information compressing parameters based upon information transfer bit rates for a selected mode, the selected mode being at least one of recording, reproducing, transmitting and receiving.

35. A recording medium having compressed data recorded thereon by the compressed data recording apparatus, or the compressed data recording, reproducing, transmitting and/or receiving method as claimed in claims 1, 8, 27 or 34.

36. The recording medium as claimed in claim 35, wherein the recording medium comprises:

an optical disc recording medium.

37. The recording medium as claimed in claim 35, wherein the recording medium comprises:

a semiconductor recording medium.

38. The method as claimed in claim 34, further comprising the step of:

decreasing the number of information-compressing parameters in response to a lower information bit rate for a selected mode.

39. The method as claimed in claim 34, further comprising the step of:

increasing the number of the information-compressing parameters in response to an increased information bit rate for a selected mode.

40. The method as claimed in claims 38 or 39, further comprising the step of:

changing the number of the information-compressing parameters in proportion to the information bit rates for each selected mode.

41. The method as claimed in claim 40, further comprising the step of:

grouping together information-compressing parameters of at least two two-dimensional blocks, arrayed in at least one of the time scale and the frequency-scale to thereby achieve a reduction in the number of the information-compressing parameters.

42. The method as claimed in claim 40, further comprising the step of:

grouping together information-compressing parameters of at least two neighboring two-dimensional blocks, arrayed in at least one of the time scale and the frequency scale to thereby achieve a reduction in the number of the information-compressing parameters.

43. The method as claimed in claim 42, further comprising the step of:

grouping together the information compressing parameters which become larger in number for the mode having a lower information bit rate in inverse proportion to the information bit rate for such mode.

44. The method as claimed in claim 43, wherein the two-dimensional block is at least one of a block-floating block and a quantization noise generation suppressing block.

45. The method as claimed in claims 30 or 44, wherein input signals are audio signals, further comprising the step of:

setting the frequency width of at least the majority of the quantization noise generation suppressing blocks to be broader towards higher frequencies.

46. The method as claimed in claims 30 or 44, further comprising the steps of:

utilizing an orthogonal transform to divide the digital signals into plural frequency components for producing signal components in plural two-dimensional blocks along time and frequency; and utilizing an inverse orthogonal transform to convert signals in the two-dimensional blocks along time and frequency into digital signals in the time domain.

47. The method as claimed in claim 46, further comprising the step of:

setting the block size of at least one of the orthogonal transform and the inverse orthogonal transform to be variable.

48. The method as claimed in claim 46, further comprising the steps of:

dividing the frequency range into plural bands, in each of which blocks are formed, each block composed of plural samples, orthogonally transforming each of the plural bands to produce coefficient data, to thereby produce signal components in the two-dimensional blocks along time and frequency;

converting signals in the plural bands in the frequency domain into signals in the time domain, by inverse orthogonally transforming signals within each of the plural bands; and synthesizing the inverse orthogonally transformed signals to produce signals in the time domain.

49. The method as claimed in claim 48, further comprising the step of:

selecting the frequency width of the plural bands to be the same for two consecutive bands in the lowest frequency range.

50. The method as claimed in claim 49, further comprising the step of:

selecting the frequency width to be broader towards higher frequencies.

51. The method as claimed in claim 50, further comprising the step of:

selecting the orthogonal transform block size to be the same among the all of the modes having different information bit rates.

52. The method as claimed in claim 51, wherein when converting compressed data between modes having different information bit rates, such conversion of the compressed data is effected on the signal components in the frequency domain.

53. The method as claimed in claim 52, wherein when mode-converting compressed data from a mode having a higher information bit rate to a mode having a lower information bit rate, the conversion of the compressed data is performed on the signal components in the frequency domain.

54. The method as claimed in claim 53, wherein when mode-converting compressed data from a mode having a lower information bit rate to a mode having a higher information bit rate, the conversion of the compressed data is performed on encoded compressed data.

55. The method as claimed in claim 34, further comprising the step of:

grouping together the information compressing parameters which become larger in number for the mode having a lower information bit rate.

56. The method as claimed in claim 34, wherein input signals are audio signals and the frequency width of at least a majority of quantization noise generation control blocks is selected to be broader towards higher frequencies.

57. The method as claimed in claim 56, wherein the two-dimensional blocks along time and frequency blocks for block floating and/or blocks for controlling the generation of quantization noise.

58. The method as claimed in claim 34, wherein an orthogonal transform is employed for dividing the digital signals into plural frequency components for producing signal components in two-dimensional blocks along time and frequency, and an inverse orthogonal transform is employed for converting signals in the two-dimensional blocks along time and frequency into digital signals in the time domain.

59. The method as claimed in claim 58, wherein the block size of the orthogonal transform or the inverse orthogonal transform is set so as to be variable.

60. The method as claimed in claim 58, wherein for dividing the digital signals into plural frequency components for producing signal components in the two-dimensional blocks along time and frequency, the frequency range is divided into plural bands, in each of which blocks each composed of plural samples are formed and orthogonal transform is executed for each band to produce coefficient data, and for converting signals in the plural bands in the frequency domain into signals in the time domain an inverse orthogonal transform is executed for each band, and respective inverse orthogonal transformed outputs are synthesized to produce synthesized signals in the time domain.

61. The method as claimed in claim 60, wherein the frequency width for divisions of at least one of time-domain signals prior to orthogonal transform into plural bands in the frequency domain and the signals generated from synthesis from plural bands in the frequency domain subsequent to inverse orthogonal transform into signals in the time domain is selected to be the same for two consecutive bands in the lowest frequency range.

62. The method as claimed in claim 61, wherein the frequency width for divisions of one of time-domain signals prior to orthogonal transform into plural bands in the frequency domain and signals generated from synthesis from plural bands in the frequency domain subsequent to inverse orthogonal transform into signals in the time domain is selected to be broader substantially towards higher frequencies.

63. The method as claimed in claim 62, wherein modified discrete cosine transform and inverse modified discrete cosine transform are utilized for orthogonal transform and inverse orthogonal transform, respectively.

64. An apparatus for recording, reproducing, transmitting and/or receiving compressed data in which digital signals are divided into signal components of plural frequency bands to produce signal components in plural two-dimensional blocks along time and frequency, the signal components being quantized and compressed for each of the two-dimensional blocks along time and frequency, and in which information compressing parameters are set for each of two-dimensional blocks along time and frequency and at least two of the information compressing parameters are grouped together so as to be recorded or transmitted along with the compressed dam, and/or in which the compressed signal components within each of the two-dimensional blocks along time and frequency are reproduced or received using the compressed data and the information compressing parameters, wherein the improvement comprises:

means for changing the grouping of information compressing parameters based upon at least one of a plurality of modes of division into the two-dimensional blocks along time and frequency.

65. The apparatus as claimed in claim 64, wherein the means for changing the grouping changes the grouping of the information compressing parameters based upon the number of divisions into the two-dimensional blocks along the time scale.

66. The apparatus as claimed in claim 64, wherein the means for changing the grouping changes the grouping of the information compressing parameters based upon the number of divisions into the two-dimensional blocks along the frequency scale.

67. The apparatus as claimed in claim 64, wherein the means for changing the grouping of information compressing parameters changes the grouping of the information compressing parameters based upon the number of divisions into the two-dimensional blocks along the frequency scale and the time scale.

68. The apparatus as claimed in claims 65, 66, or 67, wherein the means for changing the grouping of information compressing parameters, if the number of divisions into the two-dimensional blocks along at least one of the time scale and the frequency scale is a plural number, groups the information compressing parameters of a plurality of the two-dimensional blocks arrayed along the time scale and along the frequency scale in adjacency to each other.

69. The apparatus as claimed in claims 65, 66 or 67, wherein the means for changing the grouping of information compressing parameters, if the number of divisions into the two-dimensional blocks along the time scale is zero, groups the information compressing parameters of a plurality of the two-dimensional blocks arrayed along the time scale.

70. The apparatus as claimed in claim 67, wherein the information compressing parameters of a plurality of the two-dimensional blocks arrayed adjacent to each other along the frequency scale.

71. The apparatus as claimed in claims 65, 66 or 67, wherein if the two-dimensional blocks along time and frequency are formed only by division along the frequency domain, the means for changing the grouping of information compressing parameters groups the information compressing parameters of a plurality of the two-dimensional blocks arrayed along the frequency scale.

72. The apparatus as claimed in claim 71, wherein the means for changing the grouping of information compressing parameters groups information compressing parameters of a plurality of the two-dimensional blocks arrayed adjacent to each other along the frequency scale.

73. The apparatus as claimed in claims 65, 66 or 67, wherein the means for changing the grouping of information compressing parameters, if the number of divisions into the two-dimensional blocks along the time scale is a plural number, groups the information compressing parameters of a plurality of the two-dimensional blocks arrayed along the time scale.

74. The apparatus as claimed in claim 73, wherein the means for changing the grouping of information compressing parameters, groups the information compressing parameters of a plurality of the two-dimensional blocks arrayed along the time scale in adjacency to each other.

75. The apparatus as claimed in claim 74, wherein means for changing the grouping of information compressing parameters groups the information compressing parameters of a plurality of the two-dimensional blocks arrayed along the time scale and along the frequency scale in adjacency to each other.

76. An apparatus for recording, reproducing, transmitting and/or receiving compressed data in which digital signals are divided into signal components of plural frequency bands to produce signal components in plural two-dimensional blocks along time and frequency, the signal components being quantized and compressed for each of the two-dimensional blocks along time and frequency, and in which information compressing parameters are set for each of two-dimensional blocks along time and frequency and at least two of the information compressing parameters are grouped together so as to be recorded or transmitted along with the compressed data, there being plural recording and/or transmitting modes with plural different information bit rates, with the number of the information compressing parameters grouped together being the more the lower the information bit rate of the recording and/or transmitting mode, and/or in which the compressed signal components within each of the two-dimensional blocks along time and frequency are reproduced or received using the compressed data and the information compressing parameters, there being plural reproducing and/or receiving modes with plural different information bit rates, wherein the improvement comprises:

means for changing the grouping of the information compressing parameters which are to be used in common for at least two of said two-dimensional blocks based upon at least one of a plurality of modes of division into two-dimensional blocks for at least one mode of recording, transmitting, reproducing and receiving.

77. The apparatus as claimed in claim 76, wherein the means for changing the grouping the information compressing parameters changes the grouping based upon the number of divisions into the two-dimensional blocks along the time scale.

78. The apparatus as claimed in claim 76, wherein the means for changing the grouping of the information compressing parameters changes the grouping based upon the number of divisions into the two-dimensional blocks along the frequency scale.

79. The apparatus as claimed in claim 76, wherein the means for changing the grouping of the information compressing parameters changes the grouping based upon the number of divisions into the two-dimensional blocks along the frequency scale and the time scale.

80. The apparatus as claimed in claims 77, 78 or 79, wherein the means for changing the grouping of information compressing parameters, if the number of divisions into the two-dimensional blocks along the time scale and/or the frequency scale is a plural number, groups the information compressing parameters of a plurality of the two-dimensional blocks arrayed adjacent to each other along the time scale and along the frequency scale.

81. The apparatus as claimed in claims 77, 78 or 79, wherein the means for changing the grouping of information compressing parameters, if the number of divisions into the two-dimensional blocks along the time scale is zero, groups the information compressing parameters of a plurality of the two-dimensional blocks arrayed along the frequency scale.

82. The apparatus as claimed in claim 81, wherein the means for changing the grouping of information compressing parameters groups information compressing parameters of a plurality of the two-dimensional blocks arrayed adjacent to each other along the frequency scale.

83. The apparatus as claimed in claims 77, 78 or 79, wherein the means for changing the grouping of information compressing parameters, if the two-dimensional blocks along time and frequency are constituted only by division along the frequency domain, groups the information compressing parameters of a plurality of the two-dimensional blocks arrayed along the frequency scale.

84. The apparatus as claimed in claim 83, wherein the means for changing the grouping of information compressing parameters groups information compressing parameters of a plurality of the two-dimensional blocks arrayed adjacent to each other along the frequency scale are grouped and recorded or transmitted and reproduced or received.

85. The apparatus as claimed in claims 77, 78 and 79, wherein the means for changing the grouping of the information compressing parameters, if the number of divisions into the two-dimensional blocks along the time scale is a plural number, groups the information compressing parameters of a plurality of the two-dimensional blocks arrayed along the time scale.

86. The apparatus as claimed in claim 85, wherein the means for changing the grouping of the information compressing parameters groups a plurality of the two-dimensional blocks arrayed adjacent to each along the time scale.

87. The apparatus as claimed in claim 86, wherein the means for changing the grouping of information compressing parameters groups the information compressing parameters of a plurality of the two-dimensional blocks arrayed adjacent to each other along the time scale.

88. The apparatus as claimed in claim 85, further comprising:

orthogonal transform means for dividing the digital signals into plural frequency components to produce signal components in plural two-dimensional blocks along time and frequency; and inverse orthogonal transform means for converting signals in the two-dimensional blocks along time and frequency into digital signals in the time domain.

89. The apparatus as claimed in claim 88, further comprising:

means for dividing the digital signals into plural frequency components to produce signal components in the two-dimensional blocks along time and frequency, the frequency range is divided into plural bands, in each of which blocks each composed of plural samples are formed;

means for orthogonally transforming each band to produce coefficient data;

means for converting signals in the plural bands in the frequency domain into signals in the time domain by inverse orthogonally transforming each band; and means for synthesizing the signals in the time domain to produce synthesized signals in the time domain.

90. The apparatus as claimed in claims 89, further comprising:

means for selecting the frequency width of divided plural bands to be the same for two consecutive bands in the lowest frequency range for at least one of the time-domain signals prior to orthogonal transformation into plural bands in the frequency domain and the synthesized signals subsequent to inverse orthogonal transformation of such synthesized signals.

91. The apparatus as claimed in claims 88 or 89, further comprising:

means for varying the block size of at least one of the orthogonal transform and the inverse orthogonal transform.

92. The apparatus as claimed in claim 91 further comprising:

means for selecting the frequency width of division to be broader toward higher frequencies.

93. The apparatus as claimed in claim 91, further comprising:

means for selecting the frequency width of divided plural bands to be the same for two consecutive bands in the lowest frequency range for at least one of the time-domain signals prior to orthogonal transformation into plural bands in the frequency domain and the synthesized signals subsequent to inverse orthogonal transformation of such synthesized signals.

94. The apparatus as claimed in claim 85, wherein input signals are audio signals, further comprising:

means for selecting the frequency width of at least a majority of quantization noise suppression control blocks to be broader towards higher frequencies.

95. The apparatus as claimed in claim 94, wherein the two-dimensional blocks along time and frequency are at least one of blocks for block floating and blocks for controlling the generation of quantization noise.

96. A method for recording, reproducing, transmitting and/or receiving compressed data in which digital signals are divided into signal components of plural frequency bands to produce signal components in plural two-dimensional blocks along time and frequency, the signal components being quantized and compressed for each of the two-dimensional blocks along time and frequency, and in which information compressing parameters are set for each of two-dimensional blocks along time and frequency and at least two of the information compressing parameters are grouped together so as to be recorded or transmitted along with the compressed data, and/or in which the compressed signal components within each of the two-dimensional blocks along time and frequency are reproduced or received using the compressed data and the information compressing parameters, wherein the improvement comprises the step of:

changing the grouping of the information compressing parameters which are to be used in common for at least two of the two-dimensional blocks along time and frequency based upon on a selection of at least one of a plurality of modes of division into the two-dimensional blocks for at least one of recording, transmitting, reproducing and receiving.

97. The method as claimed in claim 96, wherein the manner of grouping the information compressing parameters is changed based upon on the number of divisions into the two-dimensional blocks along the frequency scale and the time scale.

98. The method as claimed in claim 96, wherein the manner of grouping the information compressing parameters is changed based upon the number of divisions into the two-dimensional blocks along the frequency scale.

99. The method as claimed in claim 96, wherein the step of changing the grouping of information compression parameters is based upon on the number of divisions into the two-dimensional blocks along the time scale.

100. The method as claimed in claims 99, 98 or 97, wherein if the number of divisions into the two-dimensional blocks along the time scale is a plural number, the information compressing parameters of a plurality of the two-dimensional blocks arrayed along the time scale are grouped.

101. The method as claimed in claim 100, wherein the information compressing parameters of a plurality of the two-dimensional blocks arrayed adjacent to each other along the time scale in adjacency to each other.

102. The method as claimed in claim 101, wherein the information compressing parameters of a plurality of the two-dimensional blocks arrayed adjacent to each other along the time scale and along the frequency scale are grouped.

103. The method as claimed in claims 99, 98 or 97, wherein if the number of divisions into the two-dimensional blocks along the time scale and/or the frequency scale is a plural number, the information compressing parameters of a plurality of the two-dimensional blocks arrayed adjacent to each other along the time scale and along the frequency scale are grouped.

104. The method as claimed in claims 99, 98 or 97, wherein if the two-dimensional blocks along time and frequency are formed only by division along the frequency domain, the information compressing parameters of a plurality of the two-dimensional blocks arrayed along the frequency scale are grouped.

105. The method as claimed in claim 104, wherein the information compressing parameters of a plurality of the two-dimensional blocks arrayed adjacent to each other along the frequency scale are grouped.

106. The method as claimed in claims 99, 98 or 97, wherein if the number of divisions into the two-dimensional blocks along the time scale is zero, the information compressing parameters of a plurality of the two-dimensional blocks arrayed along the time scale are grouped.

107. The method as claimed in claim 106, wherein the information compressing parameters of a plurality of the two-dimensional blocks arrayed adjacent to each other along the frequency scale are grouped.

108. A method for recording, reproducing, transmitting and/or receiving compressed data in which digital signals are divided into signal components of plural frequency bands to produce signal components in plural two-dimensional blocks along time and frequency, the signal components being quantized and compressed for each of the two-dimensional blocks along time and frequency, and in which information compressing parameters are set for each of two-dimensional blocks along time and frequency and at least two of the information compressing parameters are grouped together so as to be recorded or transmitted along with the compressed data, there being plural recording and/or transmitting modes with plural different information transfer bit rates, with the number of the information compressing parameters grouped together being one of the greater and lesser of the information transfer bit rate of the recording and/or transmitting mode, and/or in which the compressed signal components within each of the two-dimensional blocks along time and frequency are reproduced or received using the compressed data and the information compressing parameters, there being plural reproducing and/or receiving modes with plural different information transfer bit rates, wherein the improvement comprises the step of:

changing the grouping the information compressing parameters to be used in common based upon a selected mode of division into the two-dimensional blocks, there being plural modes of division into the two-dimensional blocks along time and frequency.

109. The method as claimed in claim 108, wherein the grouping the information compressing parameters is changed depending on the number of divisions into the two-dimensional blocks along the frequency scale and the time scale.

110. The method as claimed in claim 108, wherein the grouping the information compressing parameters is changed depending on the number of divisions into the two-dimensional blocks along the time scale.

111. The method as claimed in claim 108, wherein the grouping the information compressing parameters is changed depending on the number of divisions into the two-dimensional blocks along the frequency scale.

112. The method as claimed in claims 110, 111 or 109, wherein if the two-dimensional blocks along time and frequency are formed only by division along the frequency domain, the information compressing parameters of a plurality of the two-dimensional blocks arrayed along the frequency scale are grouped and at least one of recorded, transmitted, reproduced and received.

113. The method as claimed in claim 112, wherein the information compressing parameters of a plurality of the two-dimensional blocks arrayed adjacent to each other along the frequency scale are grouped and at least one of recorded, transmitted, reproduced and received.

114. The method as claimed in claims 110, 111 or 109, wherein if the number of divisions into the two-dimensional blocks along the time scale is zero, the information compressing parameters of a plurality of the two-dimensional blocks arrayed along the frequency scale are grouped and at least one of recorded, transmitted, reproduced and received.

115. The method as claimed in claim 114, wherein the information compressing parameters of a plurality of the two-dimensional blocks arrayed adjacent to each other along the frequency scale are grouped and at least one of recorded, transmitted, reproduced and received.

116. The method as claimed in claims 110, 111 or 109, wherein if the number of divisions into the two-dimensional blocks along the time scale and/or the frequency scale is a plural number, the information compressing parameters of a plurality of the two-dimensional blocks arrayed adjacent to each other along the time scale and along the frequency scale are grouped and at least one of-recorded, transmitted, reproduced and received.

117. The method as claimed in claims 110, 111 or 109, wherein if the number of divisions into the two-dimensional blocks along the time scale is a plural number, the information compressing parameters of a plurality of the two-dimensional blocks arrayed along the time scale are grouped and at least one of recorded, transmitted and reproduced and received.

118. The method as claimed in claim 117, wherein the information compressing parameters of a plurality of the two-dimensional blocks arrayed adjacent to each other along the time scale are grouped and at least one of recorded, transmitted, reproduced and received.

119. The method as claimed in claim 118, wherein the information compressing parameters of a plurality of the two-dimensional blocks arrayed adjacent to each other along the time scale and along the frequency scale to each other are grouped and at least one of recorded, transmitted, reproduced and received.

120. A recording medium having recorded thereon the compressed data according to claims 64, 76, 88 or 89.

121. The recording medium having the compressed data recorded thereon according to claim 120 comprising;

an optical disc recording medium.

122. The medium having the compressed data recorded thereon according to claim 120 comprising:

a semiconductor.

* * * * *